United States Patent
Agata

(10) Patent No.: US 6,229,758 B1
(45) Date of Patent: May 8, 2001

(54) SEMICONDUCTOR MEMORY DEVICE THAT CAN READ OUT DATA FASTER THAN WRITING IT

(75) Inventor: Masashi Agata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/662,149

(22) Filed: Sep. 14, 2000

(30) Foreign Application Priority Data

Sep. 16, 1999 (JP) .................................................. 11-262154

(51) Int. Cl.$^7$ ....................................................... G11C 8/00
(52) U.S. Cl. ...................... 365/233; 365/189.01; 365/239
(58) Field of Search ............................... 365/233, 189.01, 365/239

(56) References Cited

U.S. PATENT DOCUMENTS

| | | | | |
|---|---|---|---|---|
| 5,621,698 | * | 4/1997 | Lee | 365/233 |
| 5,717,652 | * | 2/1998 | Ooishi | 365/233 |
| 5,754,838 | * | 5/1998 | Shibata et al. | 395/559 |
| 5,812,464 | | 9/1998 | Kim | 365/194 |
| 5,812,490 | * | 9/1998 | Tsukude | 365/233 |
| 5,880,998 | * | 3/1999 | Tanimura et al. | 365/189.05 |

* cited by examiner

Primary Examiner—Vu A. Le
Assistant Examiner—Tuan T. Nguyen
(74) Attorney, Agent, or Firm—McDermott, Will & Emery

(57) ABSTRACT

The semiconductor memory device of the invention includes: a data storage section for storing data thereon; a data write section for writing data on the storage section; and a data read section for reading out the data stored on the storage section. The read section generates a read clock signal responsive to an external clock signal, and the write section generates a write clock signal responsive to the external clock signal. And one cycle of the read clock signal is set shorter than one cycle of the write clock signal.

10 Claims, 17 Drawing Sheets

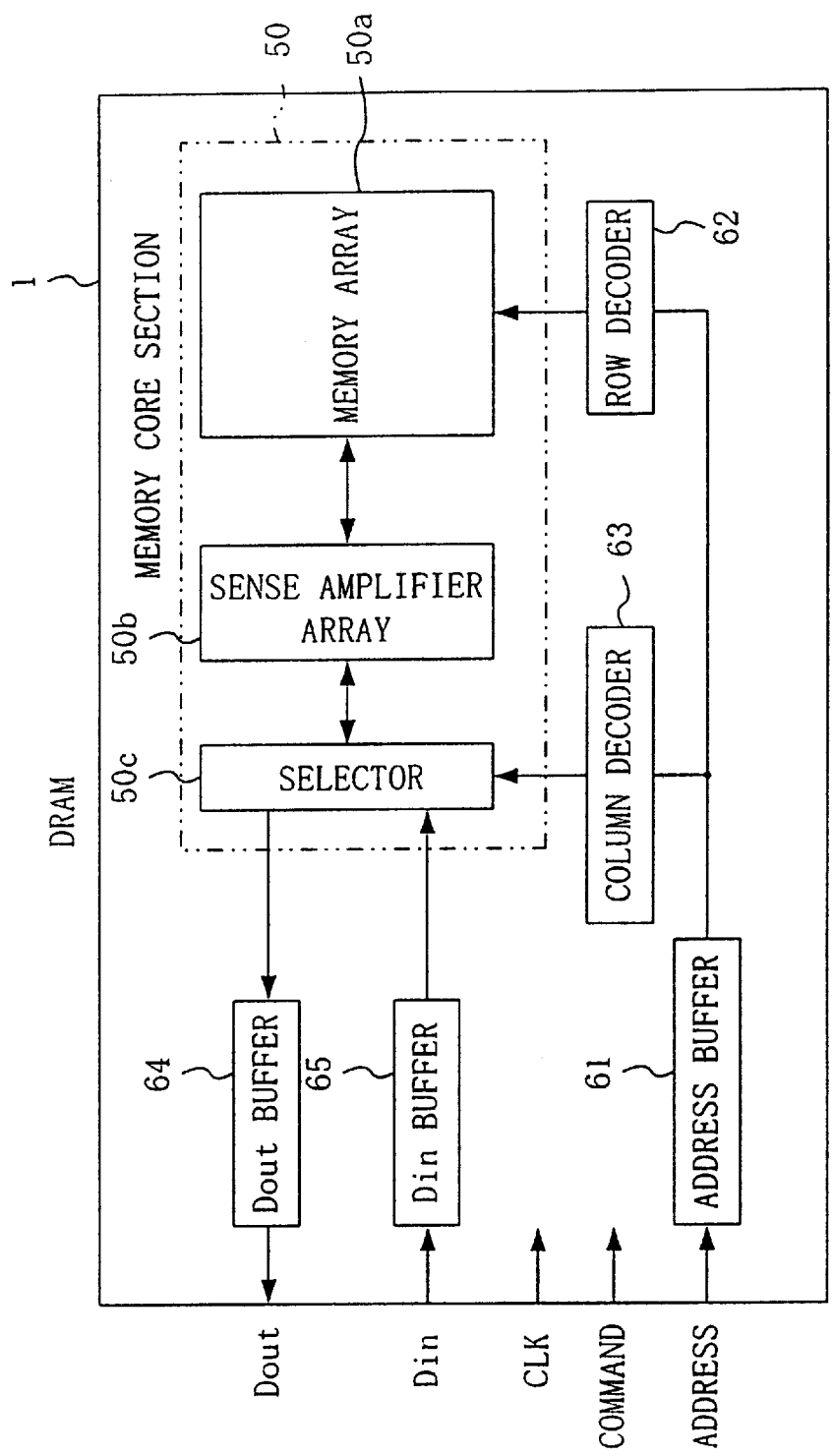

SEMICONDUCTOR MEMORY DEVICE THAT CAN READ OUT DATA FASTER THAN WRITING IT

BACKGROUND OF THE INVENTION

The present invention relates to a semiconductor memory device that can read out data faster than writing it.

Among various kinds of semiconductor memory devices, a dynamic random access memory (DRAM) is one of the types used most frequently, because the DRAM can store a huge quantity of data thereon.

Hereinafter, a known DRAM will be described with reference to FIG. 15.

FIG. 15 illustrates the memory core section and its peripheral circuits of a known DRAM. As shown in FIG. 15, the DRAM includes memory core section 100, column decoder 140, Din (input) buffer 141 and Dout (output) buffer 142. The memory core section 100 is made up of memory sub-array 110, sense amplifier array 120 and selector 130. The column decoder 140 receives clock signal CLK, column address and so on that have been input externally and sends out switching information to the selector 130. The Din buffer 141 receives WRITE data, which has been input externally and will be written on the memory sub-array 110. And the Dout buffer 142 outputs READ data, which has been read out from the memory sub-array 110, to an external unit.

In the memory sub-array 110, multiple memory cells 111 are arranged in columns and rows. Each of these memory cells 111 includes a charge-storing capacitor 112 for retaining data thereon and a cell transistor 113 for controlling over the external access to the capacitor 112.

In the sense amplifier array 120, equalizers 121 and sense amplifiers 125 are provided for respective pairs of bit lines BL and BLX. Each of the equalizers 121 supplies a precharge potential to an associated pair of bit lines BL and BLX and equalizes the potentials on these bit lines BL and BLX with each other.

The selector 130 includes write switches 131 and read switches 133. In writing data on the memory sub-array 110, each of the write switches 131 selectively connects the Din buffer 141 to an associated pair of bit lines BL and BLX responsive to a select signal WT supplied from the column decoder 140. In reading out data from the memory sub-array 110, each of the read switches 133 selectively connects the Dout buffer 142 to an associated pair of bit lines BL and BLX responsive to a select signal RD supplied from the column decoder 140. Also, the read switch 133 senses an amplified voltage value (i.e., data) on the bit line BL or its complementary bit line BLX, further amplifies the voltage value and then outputs it to a complementary data bus DL, DLX.

Next, it will be described with reference to FIG. 16 how the DRAM with such a construction reads and writes data.

FIG. 16 is a timing diagram illustrating how the known DRAM performs reading and writing.

As shown in FIG. 16, first, when a row address RA1 is input in response to a command ACT, an equalize signal EQ falls to the low level. As a result, a pair of bit lines BL and BLX, which is selected from the memory sub-array 110 at the input row address RA1, gets its equalized state canceled. Next, a selected word line WL is activated. Subsequently, sense amplifier enabling signals SAP and SAN are asserted to logically high and low states, respectively. As a result, the sense amplifier 125 senses the charge that has been stored on a target memory cell 111 through the pair of bit lines BL and BLX and then amplifies the sensed potentials on the bit lines BL and BLX to high and low levels.

Next, responsive to a command WRITE, a column address CA1 and a WRITE data word D1 are input, and the WRITE data word D1 is transferred from the Din buffer 141 through the complementary data bus DL, DLX to the memory cell 111. Subsequently, the write switch 131, associated with the input column address CA1, overwrites the data that has been stored on the target memory cell 111 connected to the bit line BL or complementary bit line BLX.

If the next data word is to be written on another memory cell 111 with the same row address as the previous one RA1 but with a different column address from it (e.g., from CA1 to CA2), then the column address CA2 and another WRITE data word D2 are input responsive to the next command WRITE and then a similar write operation is performed. The input WRITE data word, with which the previous data word has been updated, is amplified by the sense amplifier 125 as it is. Thereafter, on and after the word line WL has been deactivated in response to a precharge command PRE, charge will be stored as data on the charge-storing capacitor 112 of the memory cell 111.

Next, it will be described how the DRAM reads data.

As shown in FIG. 16, when a row address RA3 is input in response to the command ACT, the equalize signal EQ also falls to the low level. As a result, a pair of bit lines BL and BLX, which is selected from the memory sub-array 110 at the input row address RA3, gets its equalized state canceled. Next, a selected word line WL is activated. Subsequently, sense amplifier enabling signals SAP and SAN are asserted to logically high and low states, respectively. As a result, the sense amplifier 125 senses the charge that has been stored on a target memory cell 111 through the pair of bit lines BL and BLX and then amplifies the sensed potentials on the bit lines BL and BLX to high and low levels.

Next, responsive to a command READ, a column address CA3 is input. Then, the data on the pair of bit lines BL and BLX is sensed and amplified by the associated read switch 133 and then transferred as a READ data word through the complementary data bus DL and DLX to the Dout buffer 142. The data word is eventually provided as an output data word Q3 to an external unit.

If the next data word is to be read out from another memory cell 111 with the same row address as the previous one RA3 but with a different column address from it (e.g., from CA3 to CA4), then the column address CA4 is input responsive to the next command READ and then a similar read operation is performed. As a result, another output data word Q4 is provided. The data, which has been read out on the pair of bit lines BL and BLX, is retained as it is and amplified by the sense amplifier 125. Thereafter, on and after the word line WL has been deactivated in response to the precharge command PRE, charge will be stored again on the charge-storing capacitor 112 of the memory cell 111.

FIG. 17 schematically illustrates the memory core section 110 that has been accessed as shown in FIG. 16. As can be seen from FIG. 17, the data words D1 and D2 have been written on the memory cells 111 connected to the word line WL1 in a first memory sub-array 110A. On the other hand, the data words Q3 and Q4 have been read out from the memory cells 111 connected to the word line WL3 in a second memory sub-array 110B.

In the foregoing example, if the DRAM should access a plurality of memory cells with the same row address but mutually different column addresses (i.e., memory cells located on a single word line) consecutively, then commands must be input for the respective column addresses. Recently, however, a DRAM, which can consecutively read or write multiple data words at regular cycle times, was also developed. Using such a DRAM, the commands need not be input for respective column addresses, because the DRAM includes a burst counter that can change the column addresses automatically by itself.

The performance enhancement of semiconductor memory devices is one of the most urgent tasks to be accomplished. However, when the known DRAM is applied to computer graphics, for example, the DRAM cannot read out image data on the screen fast enough. That is to say, since the read speed is a key factor determining the overall system performance in that situation, the DRAM should have its operating speed further increased.

SUMMARY OF THE INVENTION

It is therefore an object of the present invention to read a sequence of data words stored consecutively, e.g., those stored on multiple memory cells accessible through a single word line, much faster.

To achieve this object, the inventive semiconductor memory device sets the read cycle time much shorter than the write cycle time. Or the write cycle time is defined to be an integral multiple of, i.e., n times (where n is an integer equal to or greater than two) as long as, the read cycle time.

Specifically, a first inventive semiconductor memory device includes: means for storing data thereon; means for writing data on the storing means; and means for reading out the data stored on the storing means. The reading means generates a read clock signal responsive to an external clock signal, while the writing means generates a write clock signal responsive to the external clock signal. One cycle of the read clock signal is set shorter than one cycle of the write clock signal.

In the first semiconductor memory device, one cycle of a read clock signal, which is generated responsive to an external clock signal, is set shorter than one cycle of a write clock signal, which is also generated responsive to the external clock signal. As shown in FIG. 16, the write and read commands WRITE and READ are both input synchronously with the leading edge of the same clock signal CLK in the conventional semiconductor memory device. In contrast, in the first inventive semiconductor memory device, one cycle of the read clock signal, which has been generated inside the device, is set shorter than one cycle of the write clock signal, which has also been generated inside the device. Accordingly, a cycle time in which a read command is input is shorter than a cycle time in which a write command is input. Thus, the inventive device can read out data faster than writing it. Suppose the data storing means is implemented as an array of memory cells that are arranged in columns and rows and accessible through multiple bit lines and word lines. In that case, if data words should be read out through two different word lines, then those data words cannot be read out so fast because two different row addresses should be input separately. However, if data words should be read out from memory cells with the same row address but with mutually different column addresses, then a sequence of data words can be read out much faster from those memory cells specified by the same row address and a series of column addresses. Thus, the inventive technique is very effectively applicable to reading out consecutive data words such as those of image data.

A second inventive semiconductor memory device includes: an array of memory cells, each storing data thereon; an input buffer for receiving externally input write data that will be written on one of the memory cells; an output buffer for outputting read data that has been read out from one of the memory cells; and a data bus for connecting the memory array to the input and output buffers. A cycle time in which the read data is transferred through the data bus is set shorter than a cycle time in which the write data is transferred through the data bus.

In the second semiconductor memory device, a cycle time in which the read data is transferred through the data bus is set shorter than a cycle time in which the write data is transferred through the data bus. In other words, a time at which a read command is input is earlier than a time at which a write command is input. Thus, the inventive device can read out data faster than writing it. Also, if data words should be read out from memory cells with the same row address but with mutually different column addresses, then a sequence of data words can be read out at a much higher speed from those memory cells specified by the series of column addresses. In this case, the read command can be input faster than the write command because a signal can have a smaller amplitude on the data bus in reading than in writing.

In one embodiment of the present invention, the second device preferably further includes: a plurality of bit lines for reading or writing data from/on the memory cells; a plurality of sense amplifiers, each sensing and amplifying a potential on associated one of the bit lines; and a selector with a switch. The switch selectively connects one of the sense amplifiers, which is associated with an externally specified address, to the data bus. A switching frequency of the switch is preferably higher in reading data than in writing data. In such an embodiment, the cycle time in which the read data is transferred through the bus can be shorter than the cycle time in which the write data is transferred through it because the switch changes its states more frequently during reading than during writing.

In this particular embodiment, the selector preferably includes a data reading selector and a data writing selector. In such an embodiment, it is easier to change the data transfer cycle time adaptively because different transfer cycle times can be defined for the read and write data.

In another embodiment, each said memory cell preferably includes: a charge-storing capacitor; a first cell transistor, which is connected to a first word line and a first bit line and through which the charge-storing capacitor is accessible; and a second cell transistor, which is connected to a second word line and a second bit line and through which the charge-storing capacitor is accessible. In this arrangement, a memory cell of a so-called "2T1C (two transistors and one capacitor)" type can be obtained. That is to say, the memory cell includes two transistors that can operate independently on the charge-storing capacitor. In other words, the memory cell is provided with first and second ports for accessing the first and second cell transistors, respectively.

In this particular embodiment, the data bus preferably includes: a first data bus connected to the first word line and the first bit line; and a second data bus connected to the second word line and the second bit line. When data is read out from the memory cells, data words, which are stored on multiple ones of the memory cells that are connected to a single word line, are output one after another through the first data bus, and then other data words, which are stored on other ones of the memory cells that are connected to another word line, are also output one after another through the second data bus. Those data words are output consecutively through the first and second word lines. In such an embodiment, data words can be read out through the two different types of ports alternately. Specifically, a sequence of data words can be read out through the first ports and a word line, and then another sequence of data words can be read out through the second ports and another word line. As a result, the data can be read out much faster.

In still another embodiment, a frequency at which the write data is transferred is preferably defined by dividing a frequency of an external clock signal. In such an embodiment, the cycle time in which the write data is transferred becomes much longer than the cycle time in which the read data is transferred. That is to say, one transfer cycle of the read data can be shorter than that of the write data.

In yet another embodiment, in writing multiple data words consecutively, the write data is preferably transferred in a cycle time about four times as long as the cycle time in which the read data is transferred. In such an embodiment, the amplitude of a signal on the data bus during writing cannot be so small as that of a signal on the data bus during reading. Thus, if the write cycle time is at least four time longer than the read cycle time, then writing can be performed just as intended.

In yet another embodiment, the second device preferably further includes: a plurality of word lines for enabling cell transistors of the memory cells; and means for generating a series of addresses, which specify multiple ones of the memory cells located on one of the word lines that has been selected by an externally input address, in reading out multiple data words from the memory array. In such an embodiment, the address generating means automatically generates a series of addresses associated with multiple consecutive memory cells that are located on a single word line. That is to say, the device can operate in the so-called "burst mode", i.e., can generate a series of column addresses automatically responsive to a single read command input. Accordingly, the command input process can be simplified and the data can be read out even faster.

In this particular embodiment, a cycle time in which each said word line is activated during writing is approximately equal in length to a cycle time in which the word line is activated during reading. In such an embodiment, the so-called "random cycles" can be equal in length to each other. Accordingly, reading, writing and inputting addresses required can all be performed in the same cycle time. That is to say, commands and addresses can be input externally in a cycle time that is determined by the random cycle only. As a result, the device can be controlled more easily using the commands.

BRIEF DESCRIPTION OF THE DRAWINGS

FIG. 1(*a*) is a block diagram illustrating two DRAMs connected to a processor through a bus; and FIG. 1(*b*) is a block diagram illustrating a processor and a DRAM that are integrated on a single chip.

FIG. 2 is a block diagram illustrating a detailed configuration for the semiconductor memory device of the first embodiment.

DESCRIPTION OF THE PREFERRED EMBODIMENTS

EMBODIMENT 1

Hereinafter, a first embodiment of the present invention will be described with reference to the accompanying drawings.

Figure 1A:
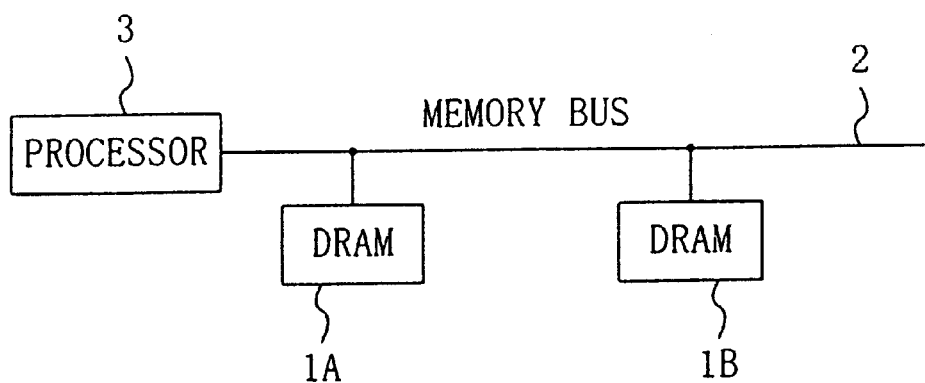
FIGS. 1(*a*) and 1(*b*) illustrate two exemplary system arrangements for a semiconductor memory device according to a first embodiment of the present invention.
Figure 1B:
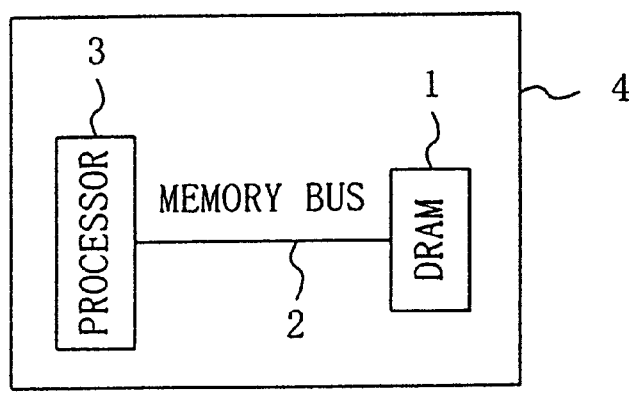

FIGS. 1(*a*) and 1(*b*) illustrate two exemplary system arrangements for a semiconductor memory device according to the first embodiment. FIG. 1(*a*) illustrates two DRAMs connected to a processor through a bus, while FIG. 1(*b*) illustrates a processor and a DRAM that are integrated on a single chip. In the arrangement shown in FIG. 1(*a*), multiple DRAMs 1A and 1B are connected to a processor 3 by way of a memory bus 2, and the processor 3 reads or updates the data stored on the DRAMs 1A and 1B.

In the arrangement shown in FIG. 1(*b*) on the other hand, a DRAM 1 and the processor 3 have been formed on a semiconductor chip 4 and are connected together via the memory bus 2.

FIG. 2 illustrates a detailed configuration for the DRAM 1. As shown in FIG. 2, the DRAM 1 includes memory array 50a, sense amplifier array 50b and selector 50c. The memory array 50a is exemplary storing means as defined in the appended claims and is made up of multiple memory cells (not shown) that are arranged in columns and rows. The sense amplifier array 50b is made up of a plurality of sense amplifiers (not shown), each sensing and amplifying a potential that has been read out from a selected one of the memory cells. And the selector 50c selects one of those sense amplifiers. In the following description, the memory array 50a, sense amplifier array 50b and selector 50c will be collectively referred to as a memory core section 50. The DRAM 1 further includes address buffer 61, row decoder 62 and column decoder 63. The address buffer 61 receives and outputs an externally input address signal. The row decoder 62 receives the address signal from the address buffer 61 and decodes the row address specified by the address signal, thereby selecting one of the word lines (not shown) from the memory array 50a. The column decoder 63 also receives the address signal from the address buffer 61, decodes the column address specified by the address signal and then outputs the decoded column address to the selector 50c. The DRAM 1 further includes Dout and Din (i.e., output and input) buffers 64 and 65. In reading out data from the memory array 50a, the data to be read is located by the sense amplifier array 50b and the data found is selected by the selector 50c and then provided as output data Dout through the Dout buffer 64 to an external unit. In writing externally input data Din on the memory array 50a on the other hand, the input data Din is received at the Din buffer 65. The DRAM 1 also receives an external clock signal CLK, with which the operation of the DRAM 1 should be timed, and various command signals indicating the specific types of operations to be performed by the DRAM 1. These clock and command signals will be described in greater detail later.

Figure 3:
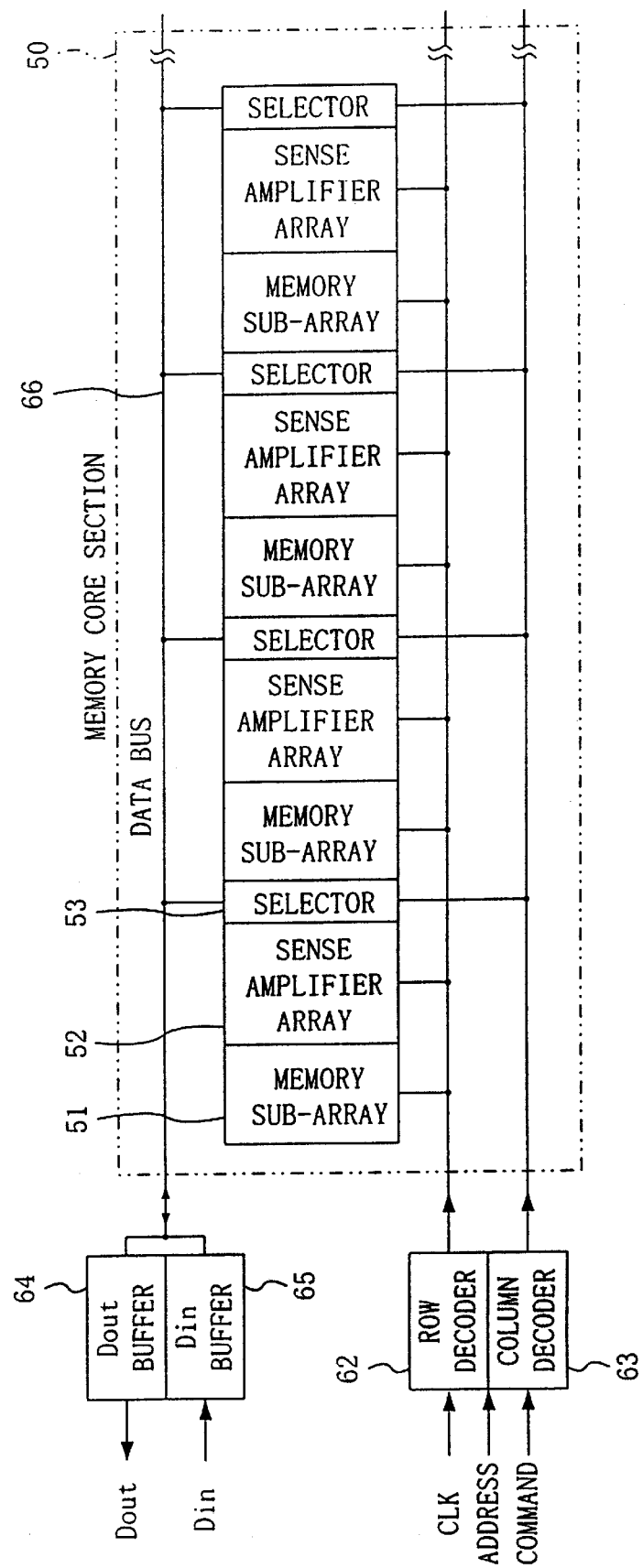
FIG. 3 is a block diagram illustrating a memory core section and its peripheral circuits of the semiconductor memory device of the first embodiment.

FIG. 3 illustrates the memory core section 50 and its peripheral circuits. As shown in FIG. 3, the memory core section 50 includes multiple memory sub-arrays 51, in each of which a great number of memory cells are also arranged in columns and rows. And each single memory sub-array 51 is provided with one sense amplifier array 52 and one selector 53.

Each of the row and column decoders 62 and 63 serves as means for reading and writing data as defined in the claims. The decoder 62 or 63 receives the externally input clock signal CLK, the address signal specifying one of the memory cells, and the command signals specifying the types of operations that the device should perform. The row decoder 62 is connected to the respective memory sub-arrays 51 and sense amplifier arrays 52. On decoding the row address received, the row decoder 62 selectively activates some memory cells (not shown) included in any of the memory sub-arrays 51 and one of the sense amplifiers (not shown) included in any of the sense amplifier arrays 52. The column decoder 63 is connected to the respective selectors 53. On decoding the column address received, the column decoder 63 selectively connects the sense amplifier, which has been selected from any of the sense amplifier arrays 52, to the Dout or Din buffer 64 or 65 by way of an (internal) data bus 66.

Figure 4:
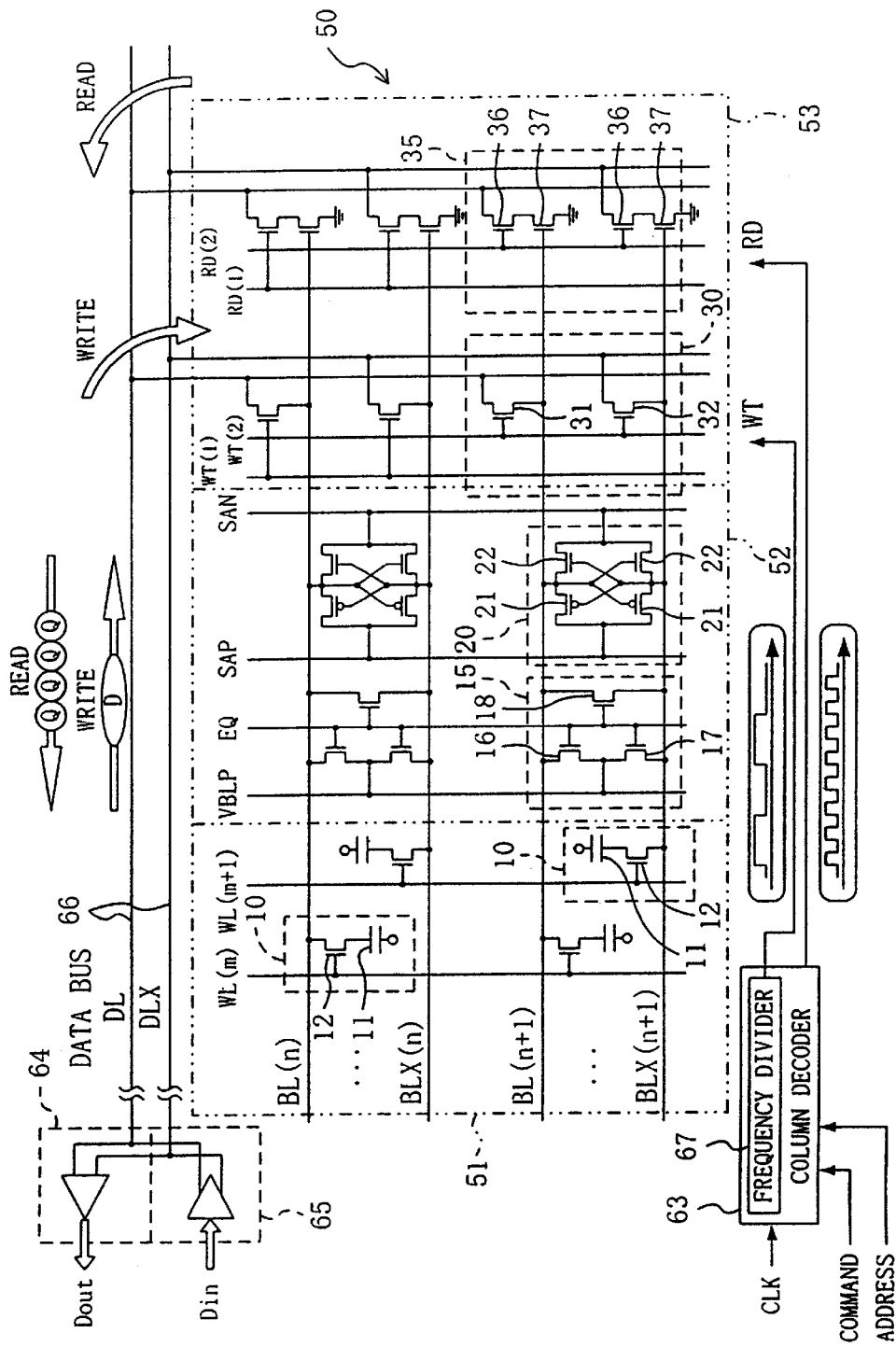
FIG. 4 is a circuit diagram illustrating the memory core section and its peripheral circuits of the semiconductor memory device of the first embodiment.

FIG. 4 illustrates an exemplary circuit configuration for the memory core section 50 and its peripheral circuits. In FIG. 4, the same components as those illustrated in FIG. 3 are identified by the same reference numerals and the description thereof will be omitted herein. As shown in FIG. 4, multiple memory cells 10 are arranged in columns and rows in the memory sub-array 51. Each of these memory cells 10 includes a charge-storing capacitor 11 for retaining charge (i.e., data) thereon and a cell transistor 12 for controlling over the external access to the capacitor 11. The source of each cell transistor 12 is connected to an electrode of the charge-storing capacitor 11 on the opposite side of its cell plate. The drain of the cell transistor 12 is connected to a bit line BL(n) (where n is an integer between 1 and N, both inclusive) or its complementary bit line BLX(n). And the gate of the cell transistor 12 is connected to a word line WL(m) (where m is an integer between 1 and M, both inclusive) intersecting with the bit line BL(n) and its complementary bit line BLX(n). In the illustrated embodiment, the number N of bit lines and the number M of word lines are both 128.

The sense amplifier array 52 includes equalizers 15 and CMOS cross-coupled sense amplifiers 20. Each of the equalizers 15 is provided for an associated pair of bit lines BL(n) and BLX(n) and includes first and second NMOS transistors 16 and 17 and an equalizing transistor 18. The first NMOS transistor 16 has its source connected to the bit line BL(n) and receives a precharge potential VBLP and an equalize signal EQ at its drain and gate, respectively. The second NMOS transistor 17 has its source connected to the complementary bit line BLX(n) and receives the precharge potential VBLP and the equalize signal EQ at its drain and gate, respectively. The equalizing transistor 18 is also implemented as an NMOS transistor to equalize the potentials on the associated pair of bit lines BL(n) and BLX(n) with each other. Accordingly, while the equalize signal EQ is being asserted, each pair of bit lines BL(n) and BLX(n) can receive the precharge potential. Each of the sense amplifiers 20 is also provided for an associated pair of bit lines BL(n) and BLX(n) and receives sense amplifier enabling signals SAP and SAN. In the sense amplifier 20, two PMOS transistors 21, 21 and two NMOS transistors 22, 22 are cross-coupled together.

The selector 53 includes multiple write switches 30. Each of the write switches 30 is provided for an associated pair of bit lines BL(n) and BLX(n) to selectively connect the pair of bit lines BL(n) and BLX(n) to the Din buffer 65. The write switch 30 includes first and second NMOS transistors 31 and 32. During writing, the first NMOS transistor 31 receives a select signal WT from the column decoder 63 at its gate and WRITE data Din at its drain, respectively, and has its source connected to the bit line BL(n). The second NMOS transistor 32 receives the select signal WT at its gate and the WRITE data Din at its drain, respectively, and has its source connected to the complementary bit line BLX(n).

The selector 53 further includes multiple read switches 35. Each of the read switches 35 is provided for an associated pair of bit lines BL(n) and BLX(n) and includes first and second NMOS transistors 36 and 37. During reading, the first NMOS transistor 36 receives a select signal RD from the column decoder 63 at its gate and has its drain connected to the data bus 66. The second NMOS transistor 37 has its gate connected to the bit line BL(n) or complementary bit line BLX(n), its source grounded and its drain connected to the source of the first NMOS transistor 36. The second NMOS transistor 37 inverts and amplifies an amplified voltage value on the associated pair of bit lines BL(n) and BLX(n). And the first NMOS transistor 36 is selectively connected to the Dout buffer 64.

In the illustrated embodiment, the column decoder 63 includes a frequency divider 67 for dividing the frequency of the external clock signal CLK by four to increase the cycle time, in which the select signal WT (i.e., internal write clock signal) is output to the write switch 30 during writing, fourfold.

Accordingly, the cycle time in which the read data Dout is transferred through the data bus 66 becomes one-fourth as long as the cycle time in which the write data Din is transferred through the bus 66. That is to say, four consecutive data words can be read out in this manner while one data word is being written. As a result, multiple data words can be read out at a high speed from a plurality of memory cells that are accessed through a single word line.

It should be noted that the foregoing arrangement of the circuits in the memory core section 50 according to the first embodiment is just an example. Thus, the same effects are also attainable by appropriately combining circuits with equivalent functions.

Hereinafter, it will be described how the DRAM with such a construction reads and writes data.

Figure 5:
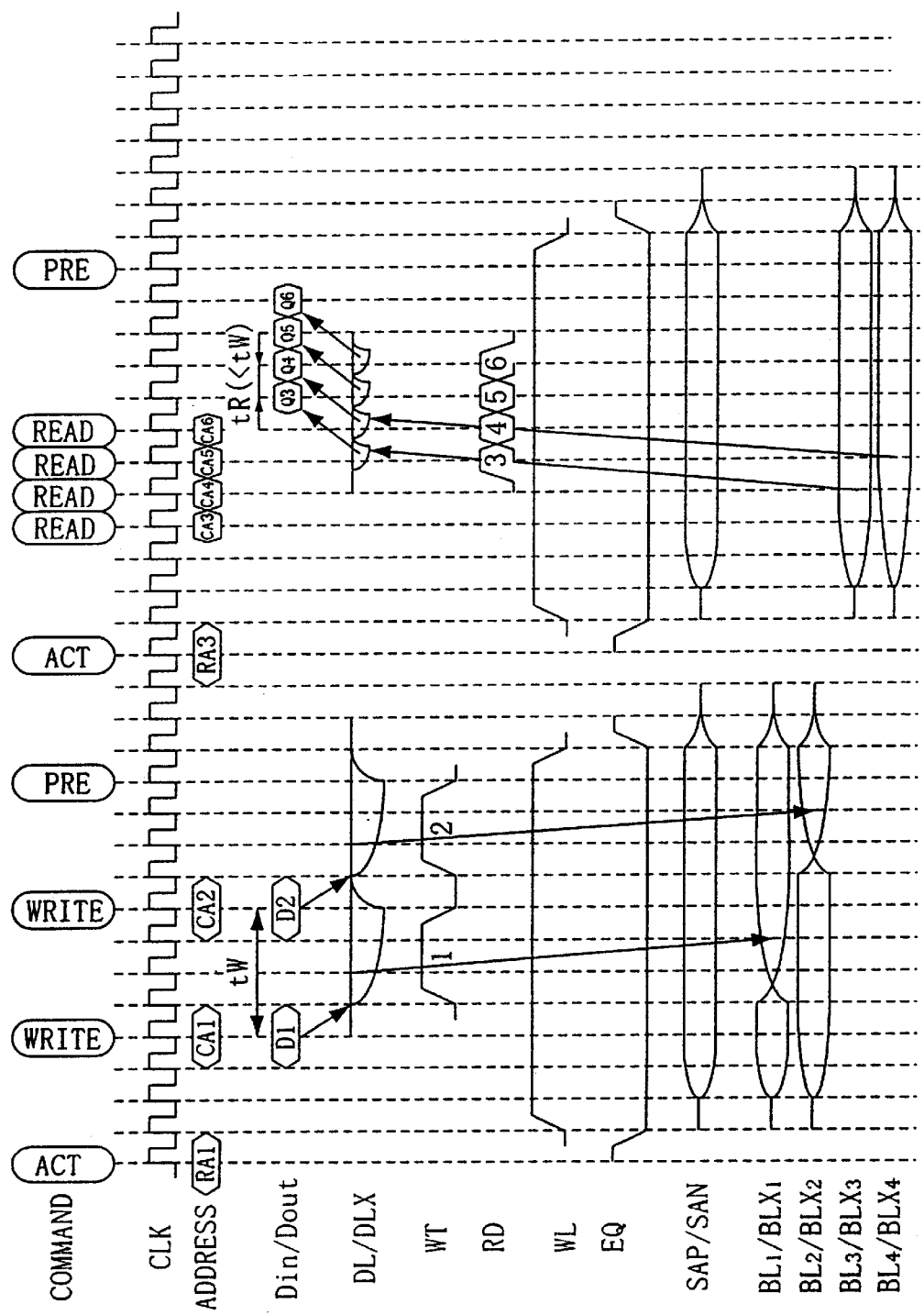
FIG. 5 is a timing diagram illustrating how the semiconductor memory device of the first embodiment operates.

FIG. 5 is a timing diagram illustrating how the DRAM of the first embodiment performs read and write operations. As shown in FIG. 5, first, when a row address RA1 is input in response to a command ACT, an equalize signal EQ falls to the low level and is negated. As a result, a pair of bit lines BL and BLX, which is selected from the memory sub-array 51 at the input row address RA1, gets its equalized state canceled. Next, a selected word line WL is activated. Subsequently, sense amplifier enabling signals SAP and SAN are asserted to logically high and low states, respectively. As a result, the sense amplifier 20 senses the charge that has been stored on a target memory cell 10 through the pair of bit lines BL and BLX and then amplifies the sensed potentials on the bit lines BL and BLX to high and low levels.

Next, responsive to a command WRITE, a column address CA1 and a WRITE data word D1 are input, and the WRITE data word D1 is transferred from the Din buffer 65 through the data bus 66 to the memory cell 10. Subsequently, the write switch 30, associated with the input column address CA1, overwrites the data that has been stored on the target memory cell 10 connected to the bit line BL or complementary bit line BLX.

If the next data word is to be written on another memory cell 10 with the same row address as the previous one RA1 but with a different column address from it (e.g., from CA1 to CA2), then another command WRITE is input next to the first command WRITE. In the illustrated embodiment, the second command WRITE is input in a cycle time that is defined by the frequency divider 67 in the column decoder 63 to be equal to four cycles of the external clock signal CLK. That is to say, the write operation is performed at this cycle time. Accordingly, responsive to the second command WRITE that is input after four cycles of the external clock signal CLK has passed, the column address CA2 and another WRITE data word D2 are input and the write operation is performed again as shown in FIG. 5. The input WRITE data word, with which the previous data word has been updated, is amplified by the sense amplifier 20 as it is. Thereafter, on and after the word line WL has been deactivated in response to a precharge command PRE, charge will be stored as data on the charge-storing capacitor 11 of the memory cell 10. Subsequently, the equalize signal EQ rises to the logically high level to equalize the potentials on the pair of bit lines BL and BLX. And the device enters a standby state to prepare for the next access.

Next, it will be described how the DRAM reads data.

As shown in FIG. 5, when a row address RA3 is input in response to a command ACT, the equalize signal EQ is also negated. As a result, a pair of bit lines BL and BLX, which is selected from the memory sub-array 51 at the input row address RA3, gets its equalized state canceled. Next, a selected word line WL is activated. Subsequently, sense amplifier enabling signals SAP and SAN are asserted to logically high and low states, respectively. As a result, the sense amplifier 20 senses the charge that has been stored on a target memory cell 10 through the pair of bit lines BL and BLX and then amplifies the sensed potentials on the bit lines BL and BLX to high and low levels.

Next, responsive to a command READ, a column address CA3 is input. Then, the data on the pair of bit lines BL and BLX is sensed and amplified by the associated read switch 35 and then transferred as a READ data word Dout through the data bus 66 to the Dout buffer 64. The data word is eventually provided as a output data word Q3 to an external unit. In this manner, one read cycle is completed.

Suppose multiple data words should be consecutively read out after that from other memory cells 10 with the same row address as the previous one RA3 but with different column addresses from it (e.g., CA4, CA5 and CA6). In that case, each of the second, third and fourth commands READ is input back-to-back with the first command READ. More exactly, each of the second, third and fourth commands READ is input every time one cycle of the external clock signal CLK is completed since the previous command READ was input. Generally speaking, the signal voltage on the data bus 66 can have its amplitude reduced easily during reading unlike during writing, and therefore, a read cycle can be completed in a shorter time than a write cycle. Thus, the data can be transferred through the data bus 66 faster during reading. In writing on the other hand, the amplitude cannot be reduced so easily because the amplified data on the bit line BL or complementary bit line BLX should be altered. Thus, according to this embodiment, reading can be performed much faster in multiple consecutive clock cycles as shown in FIG. 5.

Thereafter, the read operation will be performed in a similar manner with a series of commands READ and column addresses CA4, CA5 and CA6 input one after another every time one cycle of the external clock signal CLK is completed. Thus, the output data words Q4, Q5 and Q6 will also be output one after another, i.e., consecutively with the first output data word Q3 and synchronously with the leading edge of each external clock pulse CLK.

Next, the data, which has been read out on the pair of bit lines BL and BLX, is retained as it is and amplified by the sense amplifier 20. Thereafter, on and after the word line WL has been deactivated in response to the precharge command PRE, charge will be stored again on the charge-storing capacitor 11 of the memory cell 10 selected. And then the equalize signal EQ rises to the logically high level to equalize the potentials on the pair of bit lines BL and BLX such that the device enters a standby state to prepare for the next access.

In this manner, according to this embodiment, a data word can be read out from each of the memory cells 10, which are located on one activated word line WL, in a read cycle time tR that is one-fourth as long as a write cycle time tW.

Figure 6:
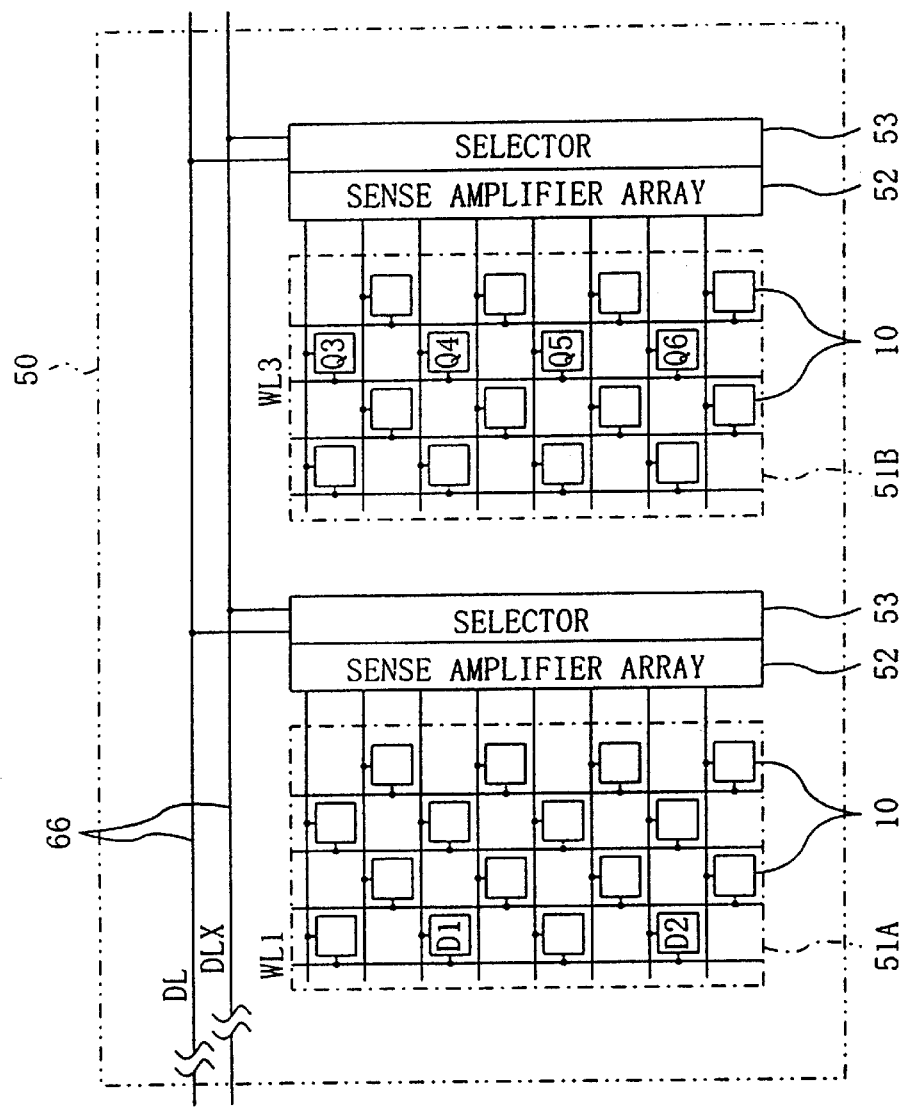
FIG. 6 is a schematic representation illustrating how the memory core section is accessed at the timing shown in FIG. 5 in the semiconductor memory device of the first embodiment.

FIG. 6 schematically illustrates how the memory core section 50 is accessed at the timing shown in FIG. 5. In FIG. 6, the same components as those illustrated in FIG. 4 are identified by the same reference numerals and the description thereof will be omitted herein. As can be seen from FIG. 6, data words D1 and D2 have been written on the memory cells 10 connected to the word line WL1 in a first memory sub-array 51A. On the other hand, a series of data words Q3, Q4, Q5 and Q6 have been read out from the memory cells 10 connected to the word line WL3 in a second memory sub-array 51B.

As described above, when a semiconductor memory device is applied to computer graphics, a data word that has been processed by the processor 3 is often written at an arbitrary address during a write operation. In reading on the other hand, image data should often be presented on the screen by reading out a series of data words consecutively from multiple memory cells 10 located on a single word line WL. Accordingly, in that situation, the present invention greatly contributes to high-speed processing of the image data, because those data words can be read out consecutively from the memory cells 10 on the single word line activated WL much faster than writing.

In the foregoing embodiment, the write cycle time tW of the internal write clock signal is defined to be four times as long as one cycle of the external clock signal CLK. Alternatively, one cycle of the external clock signal CLK may be short enough to enable the read operation as intended. In that case, the frequency division ratio should be large enough to enable consecutive write operations within the write cycle time tW of the internal write clock signal.

Modified Example 1 of Embodiment 1

Hereinafter, a first modified example of the first embodiment of the present invention will be described with reference to FIG. 7.

Figure 7:
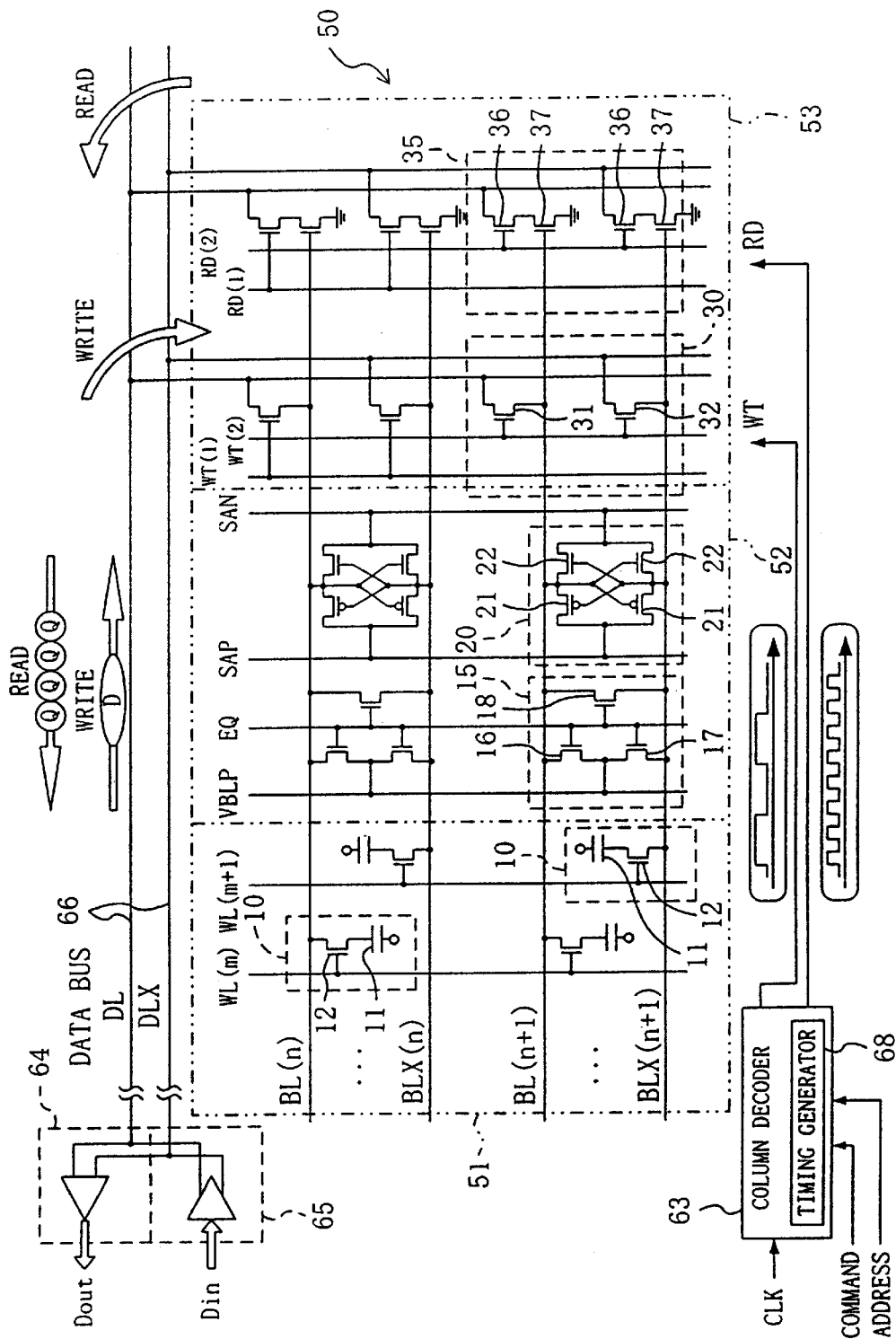
FIG. 7 is a circuit diagram illustrating a memory core section and its peripheral circuits for a semiconductor memory device according to a first modified example of the first embodiment.

FIG. 7 illustrates an exemplary circuit configuration for the memory core section 50 and its peripheral circuits of a semiconductor memory device according to the first modified example of the first embodiment. In FIG. 7, the same components as those illustrated in FIG. 4 are identified by the same reference numerals and the description thereof will be omitted herein.

In this modified example, the column decoder 63 includes a timing generator 68. The timing generator 68 sets the write cycle time tW of the internal write clock signal WT equal to one cycle of the external clock signal CLK and the read cycle time tR of the internal read clock signal RD equal to one-fourth cycle of the external clock signal CLK. In other words, the timing generator 68 sets the frequency of the internal read clock signal RD four times as high as that of the external clock signal CLK.

According to this modified example, a data word can also be read out from each of the memory cells 10, which are located on one activated word line WL, in the read cycle time tR that is one-fourth as long as the write cycle time tW.

Modified Example 2 of Embodiment 1

Hereinafter, a second modified example of the first embodiment will be described with reference to the accompanying drawings.

Figure 8:
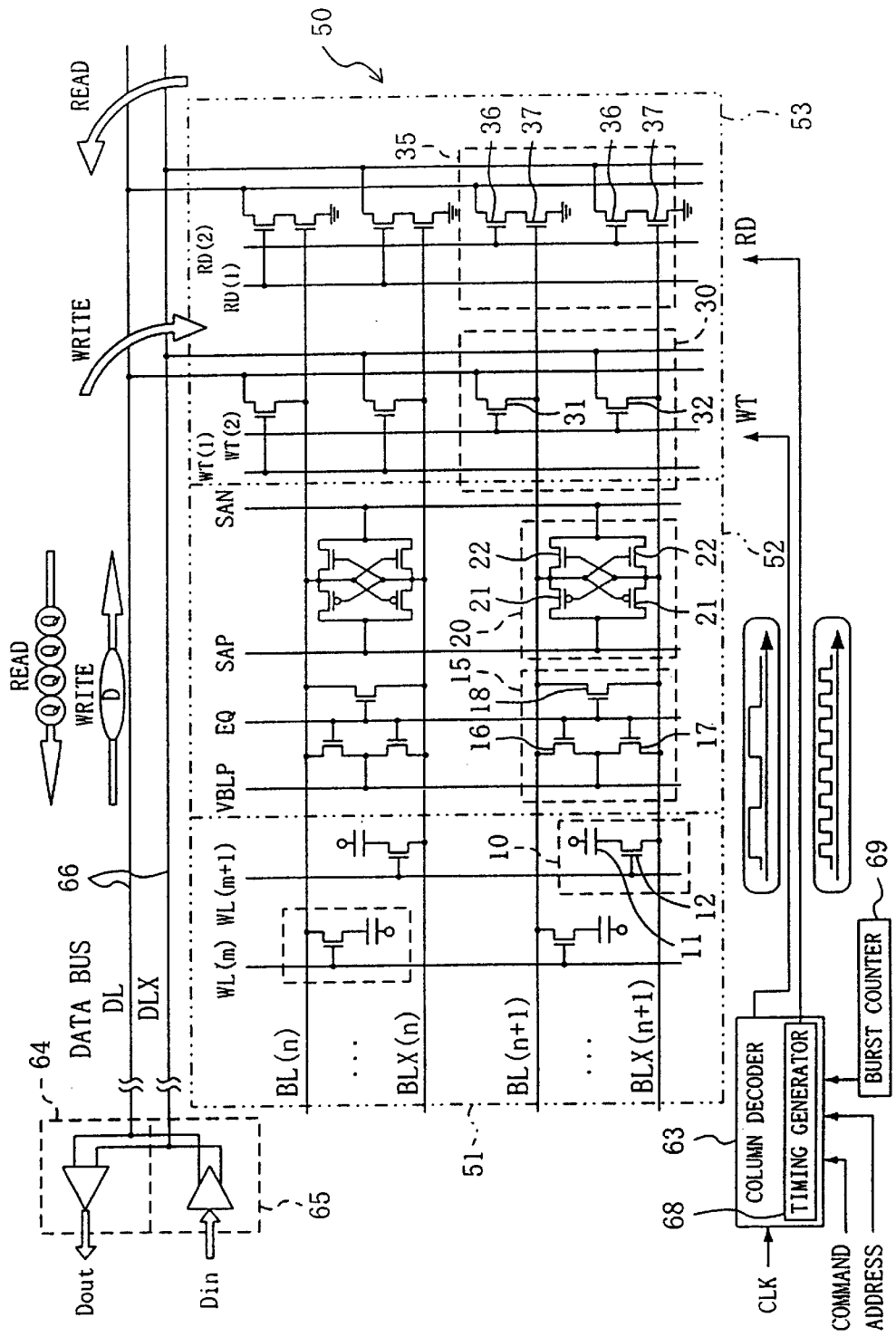
FIG. 8 is a circuit diagram illustrating a memory core section and its peripheral circuits for a semiconductor memory device according to a second modified example of the first embodiment.

FIG. 8 illustrates an exemplary circuit configuration for the memory core section 50 and its peripheral circuits of a semiconductor memory device according to the second modified example of the first embodiment. In FIG. 8, the same components as those illustrated in FIG. 4 are identified by the same reference numerals and the description thereof will be omitted herein.

In this modified example, the column decoder 63 includes the timing generator 68 and a burst counter 69. The timing generator 68 also sets the write cycle time tW of the internal write clock signal WT equal to one cycle of the external clock signal CLK and the read cycle time tR of the internal read clock signal RD equal to one-fourth cycle of the clock signal CLK. In other words, the timing generator 68 sets the frequency of the internal read clock signal RD four times as high as that of the clock signal CLK. The burst counter 69 is exemplary means for generating a series of addresses as defined in the claims and generates a series of burst addresses for four or eight consecutive data words.

Figure 9:
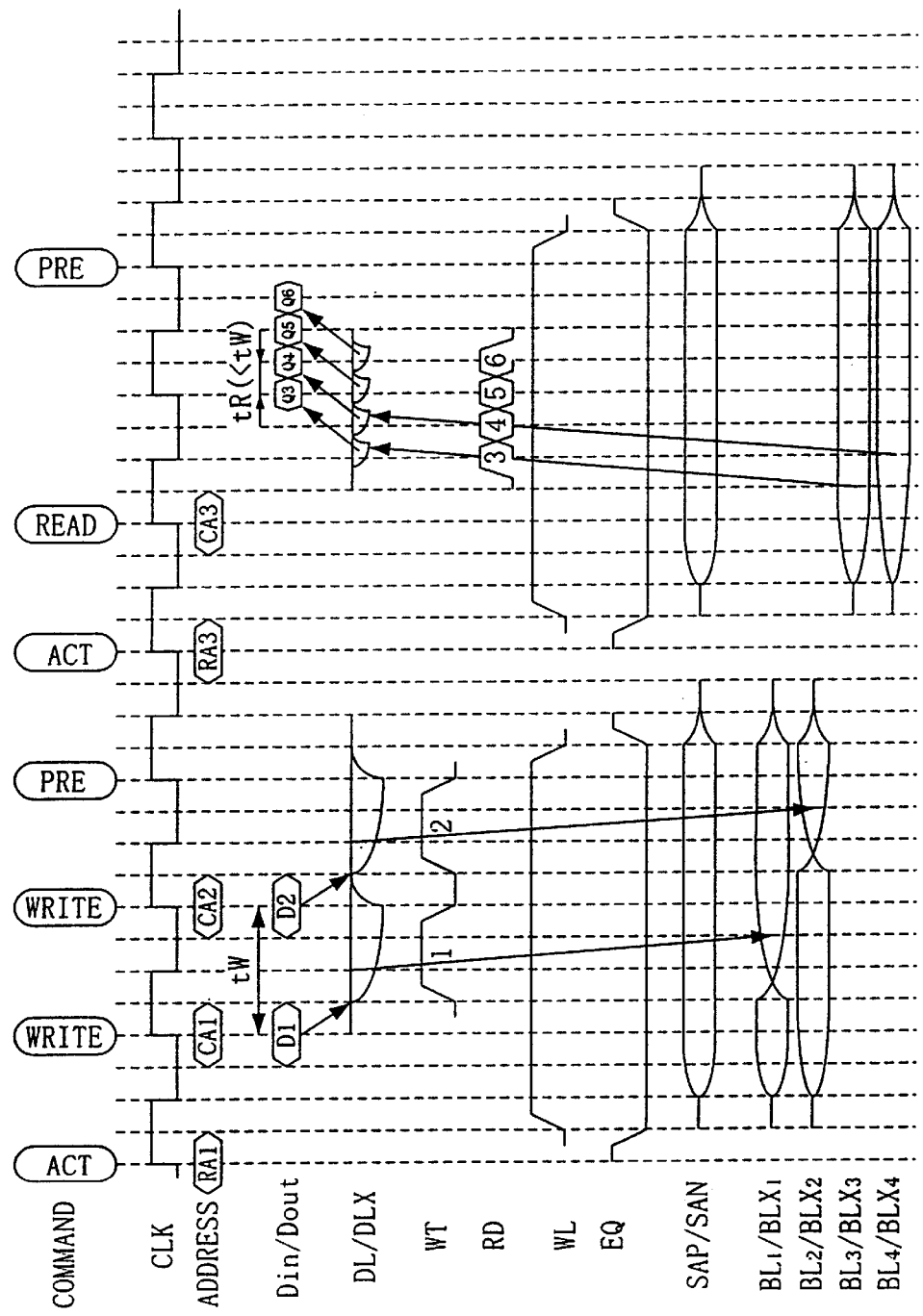
FIG. 9 is a timing diagram illustrating how the semiconductor memory device according to the second modified example of the first embodiment operates.

In this construction, a number of consecutive addresses can be generated inside the DRAM responsive to one input column address for the memory cells located on a single word line as can be seen from the timing diagram shown in FIG. 9. Thus, in the embodiment illustrated in FIG. 9, just the column address CA3 has to be input externally but there is no need to input a series of addresses externally after that. Accordingly, the DRAM can also consecutively read out the data words Q3, Q4, Q5 and Q6 from the memory cells 10, associated with a series of column addresses and located on a single word line WL3, in response to just the column address CA3 input externally, as shown in FIG. 6.

That is to say, with the burst counter 69, there is no need to input a series of commands READ externally. As a result, the semiconductor memory device can access the required data words far more easily and much faster.

It should be noted that the burst counter 69 may also be provided for a DRAM including the frequency divider 67 shown in FIG. 4.

EMBODIMENT 2

Hereinafter, a second embodiment of the present invention will be described with reference to the accompanying drawings.

Figure 10:
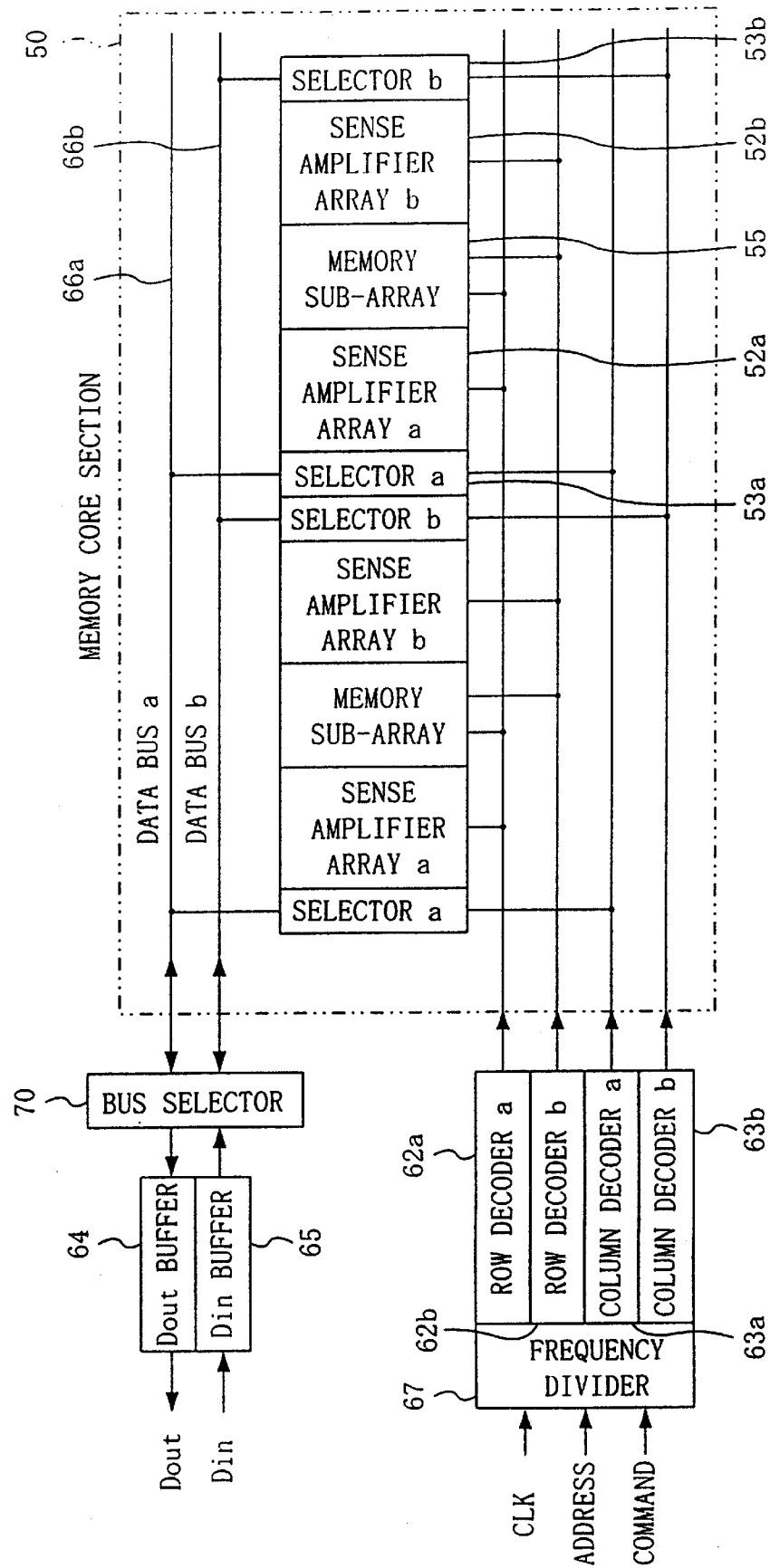
FIG. 10 is a block diagram illustrating a memory core section and its peripheral circuits for a semiconductor memory device according to a second embodiment of the present invention.

FIG. 10 illustrates a memory core section and its peripheral circuits for a semiconductor memory device according to the second embodiment. The overall configuration of the semiconductor memory device of the second embodiment may be the same as that exemplified for the first embodiment.

As shown in FIG. 10, the memory core section 50 also includes multiple memory sub-arrays 55, in each of which a plurality of memory cells are arranged in columns and rows. In the embodiment illustrated in FIG. 10, however, each memory sub-array 55 has two (or first and second) Ports a and b. Specifically, each memory sub-array 55 includes first sense amplifier array 52a and first selector 53a for Port a and second sense amplifier array 52b and second selector 53b for Port b.

The external clock signal CLK, address signal specifying a target memory cell and command signals indicating the operations of the device are input to each of first row decoder 62a and first column decoder 63a for Port a and second row decoder 62b and second column decoder 63b for Port b. In this embodiment, a frequency divider 67 for increasing the cycle time of the internal write clock signal is also provided for the first and second column decoders 63a and 63b.

The first and second selectors 53a and 53b are connected to first and second data buses 66a and 66b, respectively. Each of the first and second data buses 66a and 66b is selectively connected to the Dout or Din buffer 64 or 65 by way of a bus selector 70.

Figure 11:
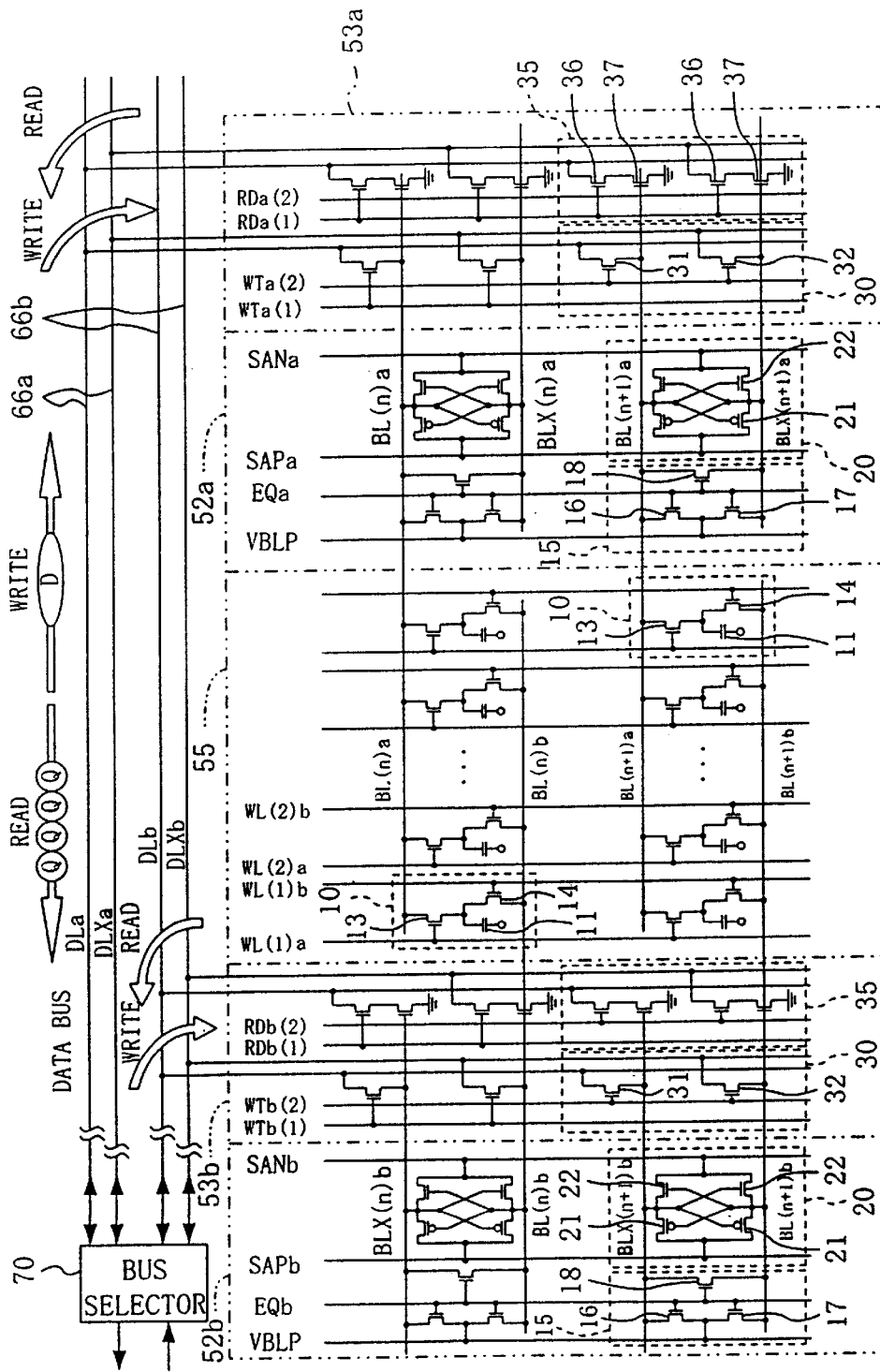
FIG. 11 is a circuit diagram illustrating the memory core section and its peripheral circuits of the semiconductor memory device of the second embodiment.

FIG. 11 illustrates an exemplary circuit configuration for the memory core section 50 and its peripheral circuits. In FIG. 11, the same components as those illustrated in FIGS. 4 and 10 are identified by the same reference numerals and the description thereof will be omitted herein. As shown in FIG. 11, multiple memory cells 10 are arranged in columns and rows in the memory sub-array 55. Each of these memory cells 10 includes a charge-storing capacitor 11 for retaining charge (i.e., data) thereon and first and second cell transistors 13 and 14 that are provided for Ports a and b, respectively, for controlling over the external access to the capacitor 11.

The source of the first cell transistor 13 is connected to an electrode of the charge-storing capacitor 11 on the opposite side of its cell plate. The drain of the first cell transistor 13 is connected to a first bit line BL(n)a for Port a (where n is an integer between 1 and N, both inclusive). And the gate of the first cell transistor 13 is connected to a first word line WL(m)a (where m is an integer between 1 and M, both inclusive) intersecting with the first bit line BL(n)a and a second bit line BL(n)b for Port b. In the illustrated embodiment, the number N of first or second bit lines BLa and BLb is 128 and the number M of first or word lines WLa or second word lines WLb for Port b is 64.

The source of the second cell transistor 14 is shared with the source of the first cell transistor 13. The drain of the second cell transistor 14 is connected to the second bit line BL(n)b. And the gate of the second cell transistor 14 is connected to a second word line WL(m)b extending in parallel to the first word line WL(m)a. In this manner, the memory cell 10 of the second embodiment is of a so-called "2T1C (two transistors and one capacitor)" type, in which two independently accessible cell transistors 13 and 14 are provided for one charge-storing capacitor 11.

As shown in FIG. 11, a complementary bit line BLX(n)a, paired with the first bit line BL(n)a and connected to the first sense amplifier array 52a and first selector 53a for Port a, extends from another memory sub-array (not shown) located on the right-hand side of the first sense amplifier array 52a, i.e., on the side opposite to the memory sub-array 55. In the same way, a complementary bit line BLX(n)b, paired with the second bit line BL(n)b and connected to the second sense amplifier array 52b and second selector 53b for Port b, extends from still another memory sub-array (not shown) located on the left-hand side of the second sense amplifier array 52b, i.e., on the side opposite to the memory sub-array 55.

Each of the first and second sense amplifier arrays 52a and 52b includes equalizers 15 and sense amplifiers 20. Each equalizer 15 of the first sense amplifier array 52a receives a first equalize signal EQa for Port a, and each sense amplifier 20 of the first sense amplifier array 52a receives first sense amplifier enabling signals SAPa and SANa for Port a. On the other hand, each equalizer 15 of the second sense amplifier array 52b receives a second equalize signal EQb for Port a, and each sense amplifier 20 of the second sense amplifier array 52b receives second sense amplifier enabling signals SAPb and SANb for Port b.

Each of the first and second selectors 53a and 53b includes multiple write switches 30 and read switches 35. The write and read switches 30 and 35 of the first selector 53a are connected to the first data bus 66a for Port a, while the write and read switches 30 and 35 of the second selector 53b are connected to the second data bus 66b for Port b.

Hereinafter, it will be described how the DRAM with this construction writes and reads data.

Figure 12:
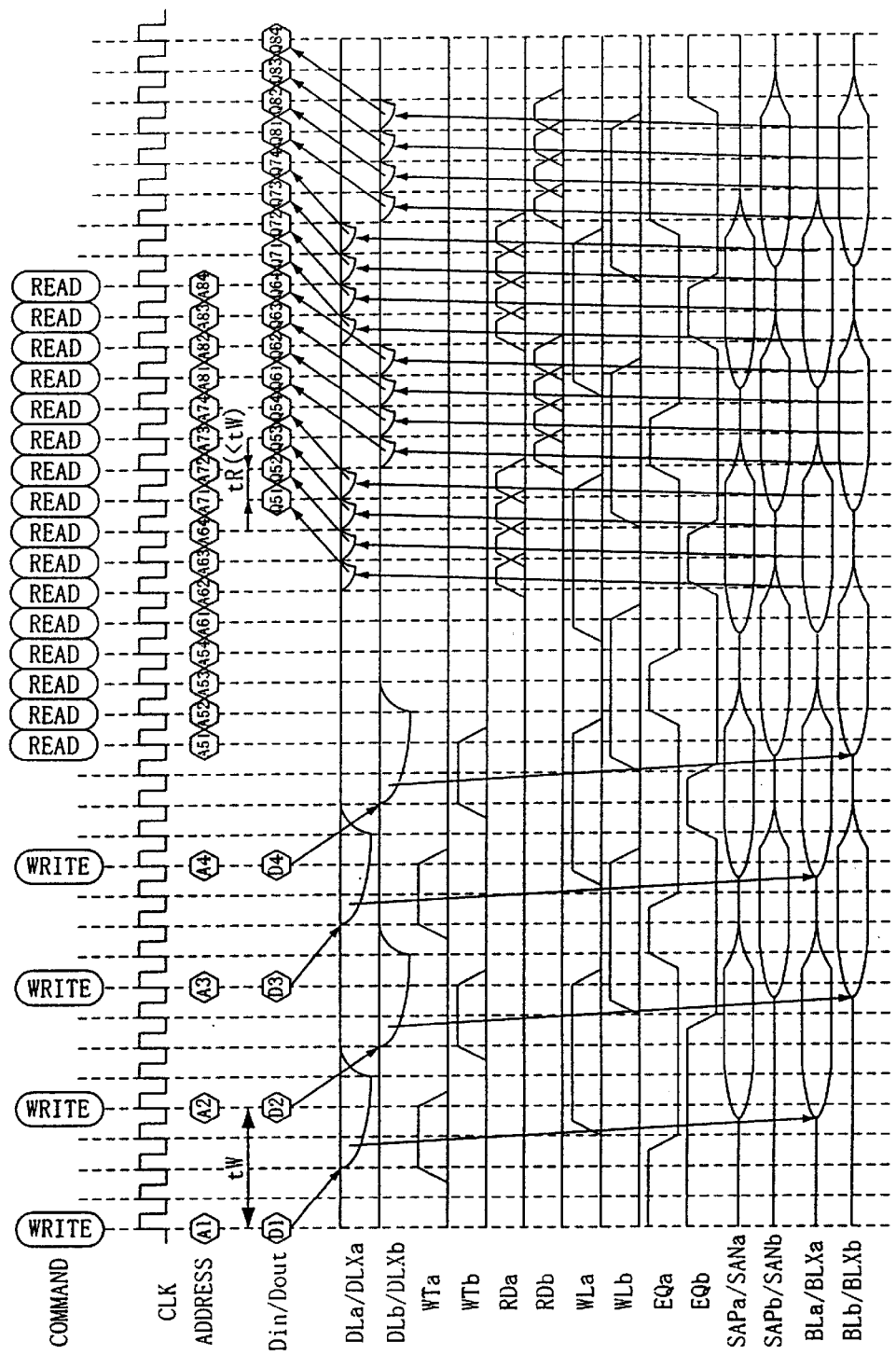
FIG. 12 is a timing diagram illustrating how the semiconductor memory device of the second embodiment operates.

FIG. 12 is a timing diagram illustrating how the DRAM of the second embodiment performs read and write operations. Unlike the first embodiment, no commands ACT are input in this embodiment and row and column addresses are input as a single pair of addresses A1 just once when a command WRITE or READ is input as shown in FIG. 12. Accordingly, in this embodiment, it depends on the state of the device at the time of command input whether the memory cell 10 should be accessed through Port a or b.

In writing, the addresses A1 and a data word D1 are input synchronously with the command WRITE. The input addresses A1 are sorted into row and column addresses inside the device.

Suppose a data write command WRITE has been input through Port a as shown in FIG. 12.

First, in response to a row address included in the input addresses A1, the first equalize signal EQa falls to the low level. As a result, a first pair of bit lines BLa and BLXa, which is selected from the memory sub-array 55 at the input row address, gets its equalized state canceled. Next, a selected first word line WLa is activated. On the other hand, a WRITE data word D1 is transferred from the Din buffer 65 through the bus selector 70 and first data bus 66a to the sense amplifier 20 that has been selected responsive to a column address included in the input addresses A1. Subsequently, the write switch 30, which has been selected responsive to a first write clock signal WTa that has already been asserted, turns ON and overwrites the potential on the selected first bit line BLa with the input data word D1.

Thereafter, first sense amplifier enabling signals SAPa and SANa are asserted to logically high and low states, respectively. As a result, the sense amplifier 20 for Port a amplifies the altered potential on the first bit line BLa. And the amplified potential will be stored on the charge-storing capacitor 11 of the memory cell 10 by way of the first cell transistor 13 that has been turned ON through the first word line WLa which is now being selected.

In this case, the cycle time of the internal clock signal WTa or WTb, determining the timing at which the write operation should be performed, is defined by dividing the frequency of the external clock signal CLK. In this embodiment, the frequency divider 67 for write control generates the internal clock signal WTa or WTb with a cycle time four times as long as one cycle of the external clock signal CLK such that every write operation is completed in one cycle of this clock signal WTa or WTb.

If another data word D2 should be written consecutively, another pair of addresses A2 and the data word D2 are input responsive to a second command WRITE that is input after four cycles of the external clock signal CLK has passed. And a similar write operation is performed using the other section of the circuit for Port b this time. When the write operation is completed, the first or second word line WLa or WLb selected is deactivated in response to a precharge signal VBLP that has been produced inside the device. Subsequently, the potential on the first or second bit line BLa or BLb selected is equalized to prepare for the next access.

By alternately accessing Ports a and b during writing, the write operations can be performed faster. This is because while the first word line WLa is being selected and activated (i.e., before the word line WLa is deactivated), for example, the second word line WLb can be activated as shown in FIG. 12.

Next, it will be described how the DRAM reads data.

In reading, the addresses A51 are also input synchronously with the command READ. The input addresses A51 are sorted into row and column addresses inside the device.

First, in response to a row address included in the input addresses A51, the first equalize signal EQa falls to the low level. As a result, a first pair of bit lines BLa and BLXa, which is selected from the memory sub-array 55 at the input row address, gets its equalized state canceled. Subsequently, the first word line WLa selected is activated.

Thereafter, the first sense amplifier enabling signals SAPa and SANa are asserted to logically high and low states, respectively. As a result, the sense amplifier 20 senses the charge that has been stored on a target memory cell 10 through the first pair of bit lines BLa and BLXa and then amplifies the sensed potentials on these bit lines BLa and BLXa to high and low levels and settles them at those levels.

The fixed-level data on the first bit line BLa is sensed and further inverted and amplified by the read switch 35 that has been selected by the column address included in the input addresses A51. The amplified data is transferred as a READ data word Q51 through the bus selector 70 to the Dout buffer 64 and eventually output to an external unit.

Suppose multiple data words should be consecutively read out after that from other memory cells 10 with the same row address as the previous one but with different column addresses from it (e.g., A52, A53 and A54). In that case, every time the command READ is input synchronously with the external clock signal CLK, the addresses A52, A53 and A54 are input one after another. As a result, a similar operation is performed by the same circuit section for Port a as in the addresses A51.

As described above, the signal voltage on the first and second data buses 66a and 66b can have its amplitude reduced easily during reading unlike during writing, and therefore, reading can be performed a number of times for a single row address. In the embodiment illustrated in FIG. 12, the read operations can be performed four times for one write cycle.

Next, the data, which has been read out on the first pair of bit lines BLa and BLXa, is retained as it is and amplified by the sense amplifier 20. Thereafter, once the first word line WLa has been deactivated in response to a precharge command PRE produced inside the device after the read operation was over, charge will be stored again on the charge-storing capacitor 11 of the memory cell 10 selected. And then the first equalize signal EQa rises to the logically high level to equalize the potentials on the first pair of bit lines BLa and BLXa and prepare for the next access.

In this manner, according to this embodiment, a data word can be read out from each of the memory cells 10, which are located on one activated word line WLa or WLb, in a read cycle time tR that is one-fourth as long as a write cycle time tW.

If reading should be further performed as shown in FIG. 12 after the series of read operations has been performed for four clock cycles, then addresses A61 through A64 are sequentially input responsive to the commands READ. In that case, read operations, similar to those carried out on the addresses A51 through A54, are performed using the other circuit section for Port b. As a result, a sequence of data words Q61, Q62, Q63 and Q64 are output.

As can be seen, if the two Ports a and b are alternately accessed by taking advantage of the characteristics of the 2T1C memory cell 10, reading can be performed much faster and non-intermittently.

Figure 13:
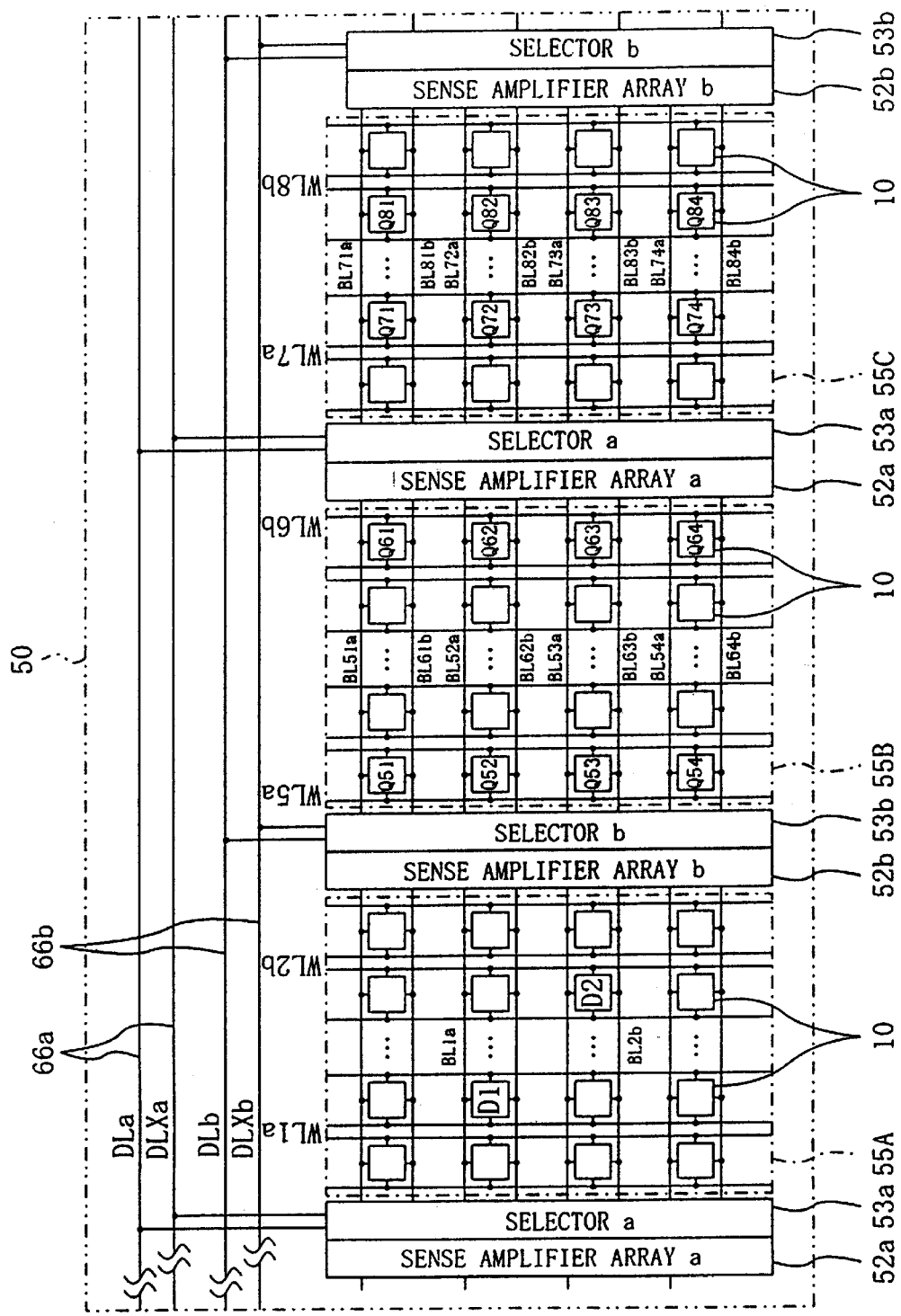
FIG. 13 is a schematic representation illustrating how the memory core section is accessed at the timing shown in FIG. 12 in the semiconductor memory device of the second embodiment.

FIG. 13 schematically illustrates how the memory core section 50 is accessed at the timing shown in FIG. 12. In FIG. 13, the same components as those illustrated in FIG. 11 are identified by the same reference numerals and the description thereof will be omitted herein. As shown in FIG. 13, the data words D1 and D2 are written on the memory cells 10 that are connected to the first and second word lines WL1a and WL2b, respectively, in the first memory sub-array 55A. In the second memory sub-array 55B, two sequences of data words Q51, Q52, Q53 and Q54 and Q61, Q62, Q63 and Q64 are read out from the memory cells 10 connected to the first word line WL5a and the memory cells 10 connected to the second word line WL6b, respectively. In the third memory sub-array 55C, two sequences of data words Q71, Q72, Q73 and Q74 and Q81, Q82, Q83 and Q84 are read out from the memory cells 10 connected to the first word line WL7a and the memory cells 10 connected to the second word line WL8b, respectively.

As in the first embodiment, the write cycle time tW of the internal write clock signal WTa or WTb is defined to be four times as long as one cycle of the external clock signal CLK. Alternatively, one cycle of the external clock signal CLK may be short enough to enable the read operation as intended. In that case, the frequency division ratio should be large enough to enable consecutive write operations within one write cycle tW of the internal write clock signal WTa or WTb.

Furthermore, instead of increasing the write cycle time tW of the internal write clock signal WTa or WTb fourfold by dividing the frequency of the external clock signal CLK, the read cycle time tR of the internal read clock signal RDa or RDb can be one-fourth cycle of the clock signal CLK.

Also, as in the first embodiment, a burst counter may be additionally provided for the column decoder 63a or 63b, which is activated during reading, such that a series of addresses can be generated consecutively for memory cells located on a single word line responsive to an externally input address. In that case, there is no need to input the addresses every time one clock cycle is completed. Accordingly, the semiconductor memory device can access the required memory cells more easily.

Figure 14:
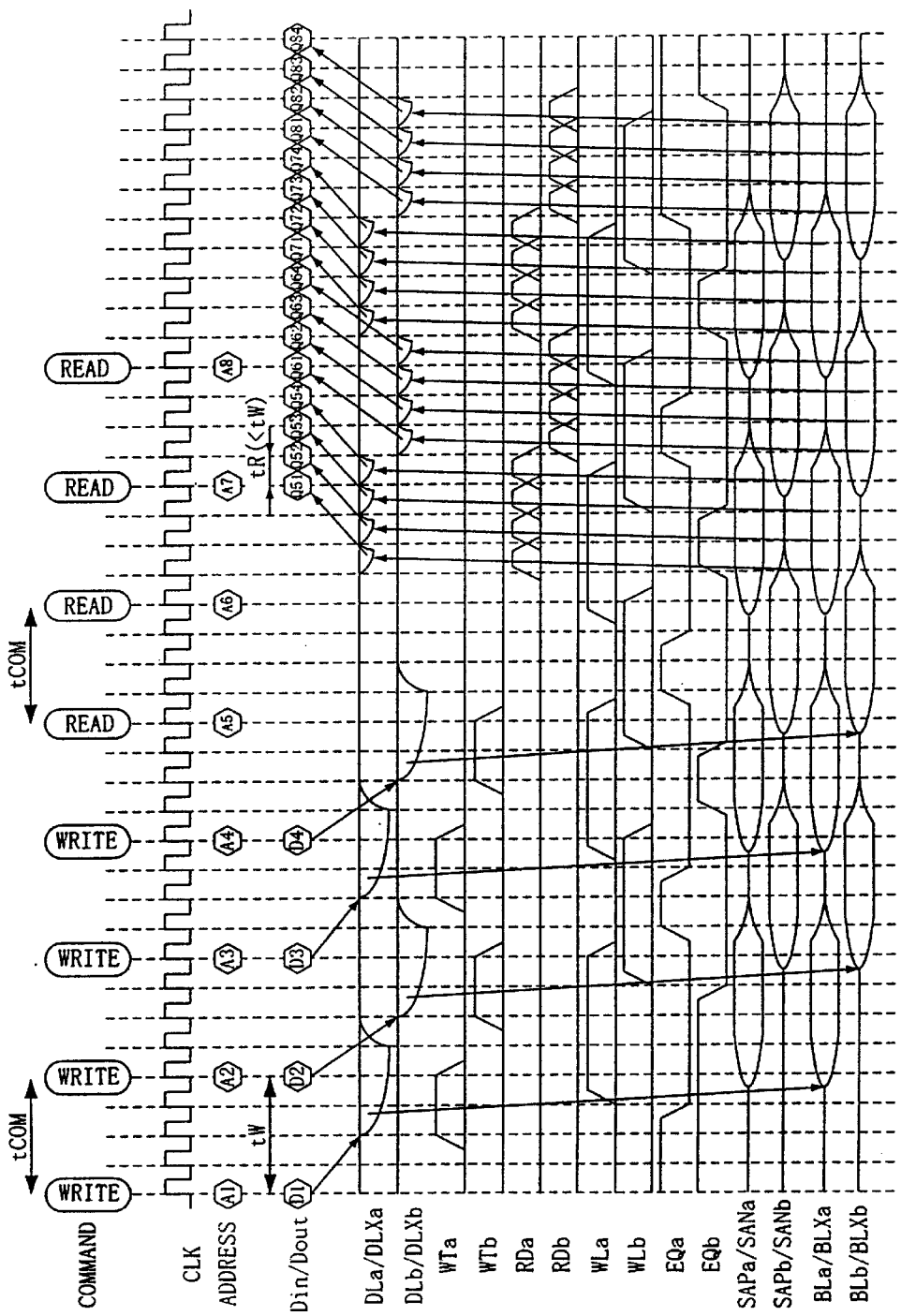
FIG. 14 is a timing diagram illustrating how the semiconductor memory device of the second embodiment operates in a burst mode.
Figure 15:
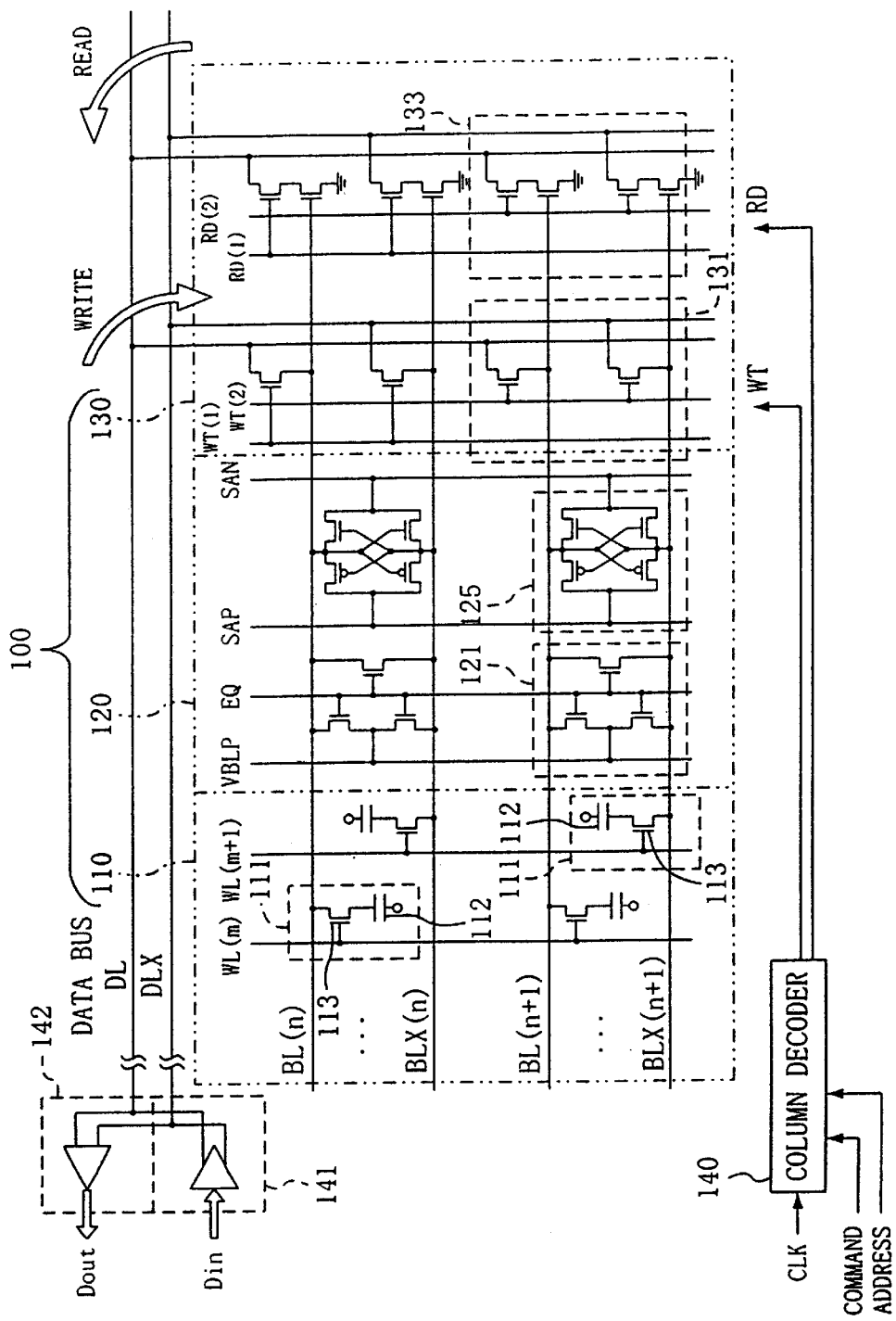
FIG. 15 is a block diagram illustrating a memory core section and its peripheral circuits of a known semiconductor memory device.
Figure 16:
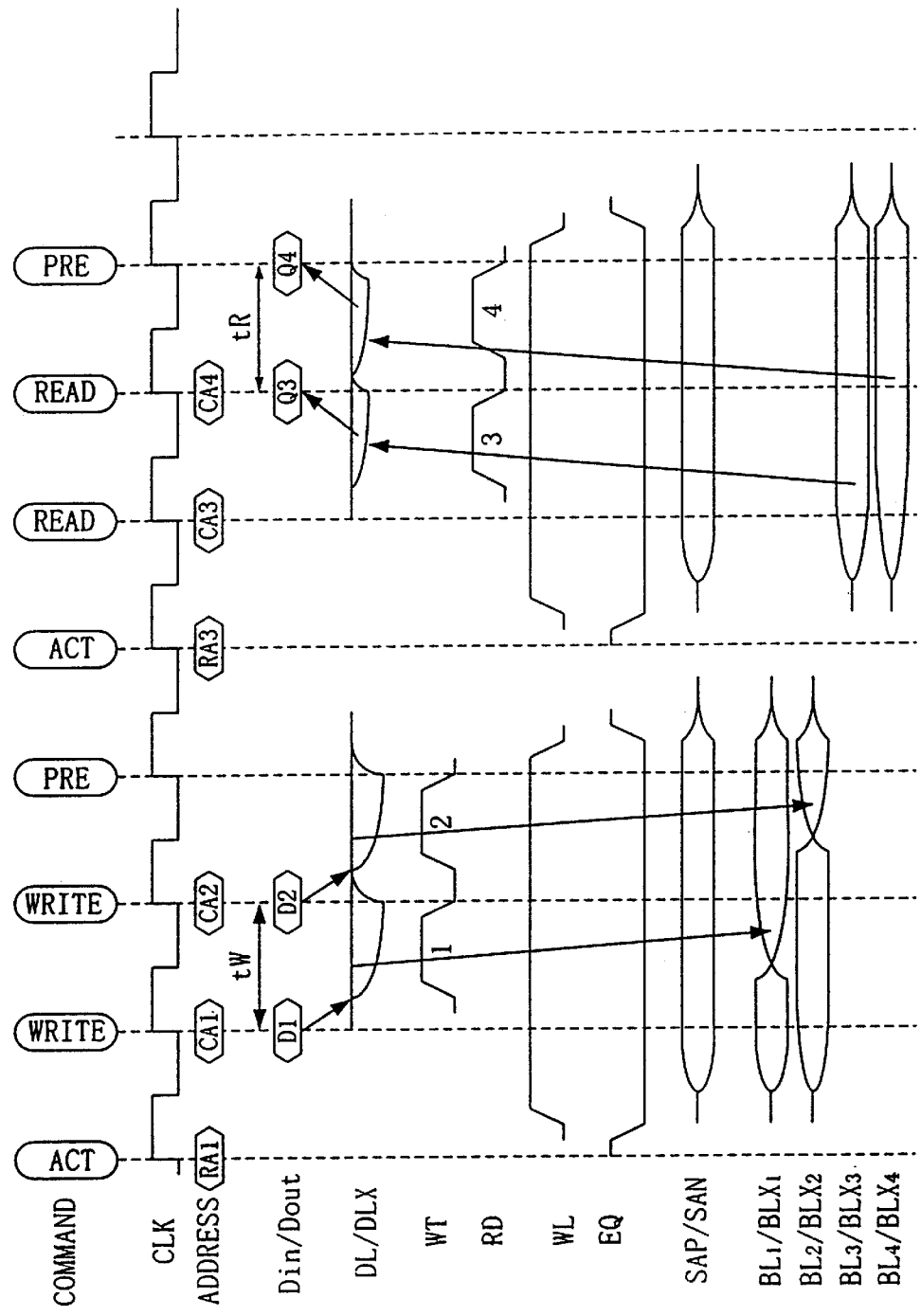
FIG. 16 is a timing diagram illustrating how the known semiconductor memory device operates.
Figure 17:
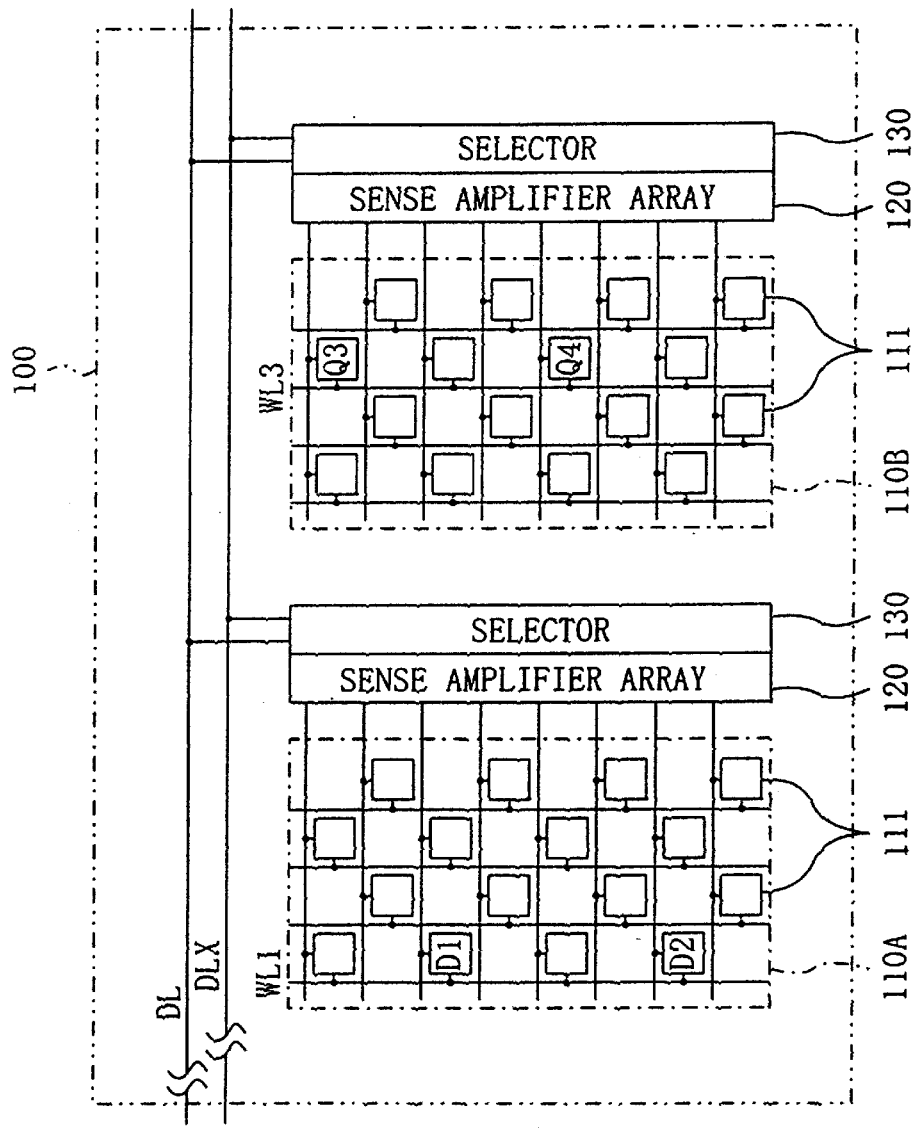
FIG. 17 is a schematic representation illustrating how the memory core section is accessed at the timing shown in FIG. 16 in the known semiconductor memory device.

FIG. 14 is a timing diagram illustrating how the semiconductor memory device of the second embodiment performs read and write operations in a burst mode. As shown in FIG. 14, the random cycles for reading and writing (or the intervals during which the word lines WLa and WLb are activated) are set equal in length to each other. In that case, the cycle times tCOM of reading, writing and associated address input operations can all be four clock cycles. Accordingly, just by externally inputting commands and addresses at regular intervals (which are determined by the random cycle only), data can be read out at a high speed and non-intermittently.

What is claimed is:

1. A semiconductor memory device comprising:
   means for storing data thereon;
   means for writing data on the storing means; and
   means for reading out the data stored on the storing means,
   wherein the reading means generates a read clock signal responsive to an external clock signal, and
   wherein the writing means generates a write clock signal responsive to the external clock signal, and
   wherein one cycle of the read clock signal is set shorter than one cycle of the write clock signal.

2. A semiconductor memory device comprising:
   an array of memory cells, each said memory cell storing data thereon;
   an input buffer for receiving externally input write data that will be written on one of the memory cells;
   an output buffer for outputting read data that has been read out from one of the memory cells; and a data bus for connecting the memory array to the input and output buffers, wherein a cycle time in which the read data is transferred through the data bus is set shorter than a cycle time in which the write data is transferred through the data bus.

3. The device of claim 2, further comprising:

a plurality of bit lines for reading or writing data from/on the memory cells;

a plurality of sense amplifiers, each sensing and amplifying a potential on associated one of the bit lines; and a selector with a switch, the switch selectively connecting one of the sense amplifiers, which is associated with an externally specified address, to the data bus, wherein a switching frequency of the switch is higher in reading data than in writing data.

4. The device of claim 3, wherein the selector includes a data reading selector and a data writing selector.

5. The device of claim 2, wherein each said memory cell comprises:

a charge-storing capacitor;

a first cell transistor, which is connected to a first word line and a first bit line and through which the charge-storing capacitor is accessible; and a second cell transistor, which is connected to a second word line and a second bit line and through which the charge-storing capacitor is accessible.

6. The device of claim 5, wherein the data bus comprises: a first data bus connected to the first word line and the first bit line; and a second data bus connected to the second word line and the second bit line, and wherein when data is read out from the memory cells, data words, which are stored on multiple ones of the memory cells that are connected to a single word line, are output one after another through the first data bus, and then other data words, which are stored on other ones of the memory cells that are connected to another word line, are also output one after another through the second data bus, the data words being output consecutively through the first and second word lines.

7. The device of claim 2, wherein a frequency at which the write data is transferred is defined by dividing a frequency of an external clock signal.

8. The device of claim 2, wherein in writing multiple data words consecutively, the write data is transferred in a cycle time about four times as long as the cycle time in which the read data is transferred.

9. The device of claim 2, further comprising:

a plurality of word lines for enabling cell transistors of the memory cells; and means for generating a series of addresses, which specify multiple ones of the memory cells located on one of the word lines that has been selected by an externally input address, in reading out multiple data words from the memory array.

10. The device of claim 9, wherein a cycle time in which each said word line is activated during writing is approximately equal in length to a cycle time in which the word line is activated during reading.

* * * * *